(12) United States Patent
Ye et al.

(10) Patent No.: US 8,542,340 B2
(45) Date of Patent: Sep. 24, 2013

(54) ILLUMINATION OPTIMIZATION

(75) Inventors: Jun Ye, Palo Alto, CA (US); Yu Cao, Cupertino, CA (US); Hanying Feng, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 336 days.

(21) Appl. No.: 13/003,294

(22) PCT Filed: Jul. 7, 2009

(86) PCT No.: PCT/US2009/049792
§ 371 (c)(1),
(2), (4) Date: Jan. 7, 2011

(87) PCT Pub. No.: WO2010/005957
PCT Pub. Date: Jan. 14, 2010

(65) Prior Publication Data
US 2011/0116067 A1    May 19, 2011

Related U.S. Application Data

(60) Provisional application No. 61/078,599, filed on Jul. 7, 2008.

(30) Foreign Application Priority Data

Nov. 12, 2008  (NL) .................................... 1036189
Dec. 1, 2008  (JP) ............................... 2008-305942

(51) Int. Cl.
*G03B 27/32* (2006.01)
*G03B 27/68* (2006.01)

(52) U.S. Cl.
USPC ............................................ 355/52; 355/77

(58) Field of Classification Search
USPC ............. 355/52, 53, 55, 67–71, 77; 430/311; 716/19
See application file for complete search history.

(56) References Cited

U.S. PATENT DOCUMENTS 5,229,872 A   7/1993  Mumola
5,296,891 A   3/1994  Vogt et al.
(Continued)

FOREIGN PATENT DOCUMENTS

| EP | 1465016 | 10/2004 |
| EP | 1920369 | 2/2007 |
| EP | 1941321 | 3/2007 |
| EP | 1793279 | 6/2007 |

OTHER PUBLICATIONS

U.S. Office Action mailed Jul. 27, 2012 in corresponding U.S. Appl. No. 12/615,004.

(Continued)

*Primary Examiner* — Hung Henry Nguyen
(74) *Attorney, Agent, or Firm* — Pillsbury Winthrop Shaw Pittman LLP

(57) ABSTRACT

A method of optimizing an illumination pupil shape for a lithographic process comprises identifying a target pattern to be imaged by said lithographic process. It further comprises identifying at least one optimization point in said target pattern and identifying at least one design for manufacturing metric per optimization point. Additionally, it comprises selecting a set of illumination source points based on the identified at least one design for manufacturing metric and determining the illumination pupil shape based on the selected set of illumination source points.

16 Claims, 13 Drawing Sheets

(56) References Cited

U.S. PATENT DOCUMENTS

| | | | |
|---|---|---|---|
| 5,523,193 A | 6/1996 | Nelson | |
| 5,680,588 A * | 10/1997 | Gortych et al. | 430/30 |
| 5,969,441 A | 10/1999 | Loopstra et al. | |
| 6,046,792 A | 4/2000 | Van Der Werf et al. | |
| 7,003,758 B2 * | 2/2006 | Ye et al. | 716/52 |
| 7,864,301 B2 * | 1/2011 | Socha | 355/77 |
| 8,043,797 B2 * | 10/2011 | Hansen | 430/322 |
| 2004/0197672 A1 * | 10/2004 | Weed et al. | 430/5 |
| 2005/0015233 A1 | 1/2005 | Gordon | |
| 2005/0195379 A1 | 9/2005 | Stanton et al. | |
| 2009/0157360 A1 | 6/2009 | Ye et al. | |

OTHER PUBLICATIONS

Cao, Y. et al., "Optomized Hardware and Software For Fast, Full Chip Simulation", Proc. of SPIE, vol. 5754, pp. 407-414 (2005).

Granik, Y., "Source Optimization for Image Fidelity and Throughput", J. Microlith., Microfab., Microsyst., vol. 3, No. 4, pp. 509-522 (Oct. 2004).

Rosenbluth, A.E. et al., "Optimum Mask and Source Patterns to Print A Given Shape", J. Microlith., Microfab., Microsyst., vol. 1, No. 1, pp. 13-30 (Apr. 2002).

Spence, C., "Full Chip Lithography Simulation and Design Analysis—How OPC is Changing IC Design", Proc. of SPIE, vol. 5751, pp. 1-14 (2005).

International Search Report issued Oct. 13, 2009 in parent PCT/US2009/049792.

International Preliminary Report on Patentability mailed Jan. 20, 2011 in corresponding International Application No. PCT/US2009/049792.

* cited by examiner

ILLUMINATION OPTIMIZATION

CROSS-REFERENCE TO RELATED APPLICATION

The present application claims priority from JP 2008-305942, filed on Dec. 1, 2008 with the Japanese patent office, NL 1036189 filed with the Dutch patent office on Nov. 12, 2008 and U.S. 61/078,599, filed on Jul. 7, 2008 with the US patent office, the full contents of which are hereby included in their entirety by reference.

TECHNICAL FIELD

The technical field of the present invention relates generally to a method of optimizing an illumination pupil shape for a lithographic process, a device manufacturing method, a method of producing a diffractive optical element and a computer readable medium bearing a computer program for optimizing an illumination pupil shape.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed Vat which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process, in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally a difficult, time consuming, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

While full-chip numerical simulation of the lithographic patterning process has been demonstrated at a single process condition, typically best focus and best exposure dose or best 'nominal' condition, it is well known that manufacturability of a design requires sufficient tolerance of pattern fidelity against small variations in process conditions that are unavoidable during actual manufacturing. This tolerance is commonly expressed as a process window, defined as the width and height (or 'latitude') in exposure-defocus space over which CD or edge placement variations are within a predefined margin (i.e., error tolerance), for example ±10% of the nominal line width. In practice, the actual margin requirement may differ for different feature types, depending on their function and criticality. Furthermore, the process window concept can be extended to other basis parameters in addition to or besides exposure dose and defocus.

Manufacturability of a given design generally depends on the common process window of all features in a single layer. While state-of-the-art OPC application and design inspection methods are capable of optimizing and verifying a design at nominal conditions, it has been recently observed that process-window aware OPC models will be required in order to ensure manufacturability at future process nodes due to ever-decreasing tolerances and CD requirements.

Currently, in order to map out the process window of a given design with sufficient accuracy and coverage, simulations at N parameter settings (e.g., defocus and exposure dose) are required, where N can be on the order of a dozen or more. Consequently, an N-fold multiplication of computation time is necessary if these repeated simulations at various settings are directly incorporated into the framework of an OPC application and verification flow, which typically will involve a number of iterations of full-chip lithography simulations. However, such an increase in the computational time is prohibitive when attempting to validate and/or design a given target circuit.

As such, there is a need for simulation methods and systems which account for variations in the process-window that can be used for OPC and RET verification, and that are more computationally efficient than such a 'brute-force' approach of repeated simulation at various conditions as is currently performed by known prior art systems. Such a simulation method is disclosed in U.S. Application No. 60/992,546 and Ser. No. 12/315,849, assigned to Brion Technologies.

In addition, calibration procedures for lithography models are required that provide models being valid, robust and accurate across the process window, not only at singular, specific parameter settings. Such a calibration process is disclosed in U.S. Application No. 60/706,144 and in EP1920369, also assigned to Brion Technologies.

In addition to performing the foregoing mask adjustments (e.g., OPC) in an effort to optimize the imaging results, the illumination scheme utilized in the imaging process can be also optimized, either jointly with mask optimization or separately, in an effort to improve the overall lithography fidelity. Since the 1990s, many off-axis light sources, such as annular, quadrupole, and dipole, have been introduced, and have provided more freedom for OPC design, thereby improving the imaging results. As is known, off-axis illumination is a proven way to resolve fine structures (i.e., target features) contained in the mask. However, when compared to a traditional illuminator, an off-axis illuminator usually provides less light intensity for the aerial image (AI). Thus, it becomes necessary to attempt to optimize the illuminator to achieve the optimal balance between finer resolution and reduced light intensity.

Numerous prior art illumination optimization approaches are known. For example, in an article by Rosenbluth et al., titled "Optimum Mask and Source Patterns to Print A Given Shape", Journal of Microlithography, Microfabrication, Microsystems 1(1), pp. 13-20, (2002), the source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for wafer image fidelity and the smoothness requirement of the source.

It is an object of the invention to provide an improved method for optimizing an illumination pupil shape for a lithographic process.

According to a first aspect of the invention, this object is reached by a method comprising the steps of identifying a target pattern to be imaged by said lithographic process, identifying at least one optimization point in said target pattern, identifying at least one design for manufacturing metric per optimization point, selecting a set of illumination source points based on the identified at least one design for manufacturing metric and determining the illumination pupil shape based on the selected set of illumination source points.

According to a further aspect of the invention, a computer readable medium is provided, bearing a computer program for optimizing an illumination pupil shape, the computer program, when executed, causing a computer to perform the steps of the method according to the first aspect of the invention.

According to an aspect of the invention, a method of producing a diffractive optical element is provided, comprising:

determining an illumination pupil shape for a lithographic process, and producing a diffractive pattern on the diffractive optical element based on the determined illumination pupil shape.

The present invention relates to a method which allows for a computation efficient technique for performing illuminator/source optimization.

More specifically, the present invention provides several methods for efficient illuminator optimization which can be implemented with the use of programmable illuminator mask. In one embodiment, all the illumination source points are ranked according to the DFM metrics and the best illumination source points are selected to form an illumination source map. As the illumination source points are mutually incoherent from each other, and in this embodiment, the DFM metric is assumed to be non-interferential with each other between the different source points, the source points necessary for optimal illumination can be selected one by one, starting from the source point having the highest DFM metric, and proceeding downward. In an embodiment the DFM metric is edge slope and it is only necessary to select a few source points that provide the highest edge slopes for the critical circuit locations.

In another embodiment of the present invention, the illumination optimization is combined with polynomialization of a transmission cross coefficient. After selecting the source points that provide the highest edge slope, a small amount of additional illumination source points are selected that have the largest defocus coefficients opposite to the sign of the already-selected illumination source points, so to cancel out the defocus sensitivity. As explained further below, this approach will further enlarge the resulting process window.

The present invention provides significant advantages over prior art methods. Different from traditional approaches, the method disclosed herein allows for the use of a programmable illuminator mask and for the design of optimal patterns for the illuminator mask according the design target. Using a programmable mask it is possible to derive the most general shaped illuminators. Most importantly, the present invention provides a computational efficient illuminator optimization process. The present invention is substantially guaranteed to achieve a global optimum. Further, the present invention does not rely on the assumption of source distribution uniformity or the choice of some extra parameters, (e.g., parameter $\gamma$ in Granik's method) as required by some prior art methods. In an embodiment, the optimization process of the present invention also substantially cancels out defocus sensitivity thereby enlarging the resulting process window of the imaging process.

Figure 1:
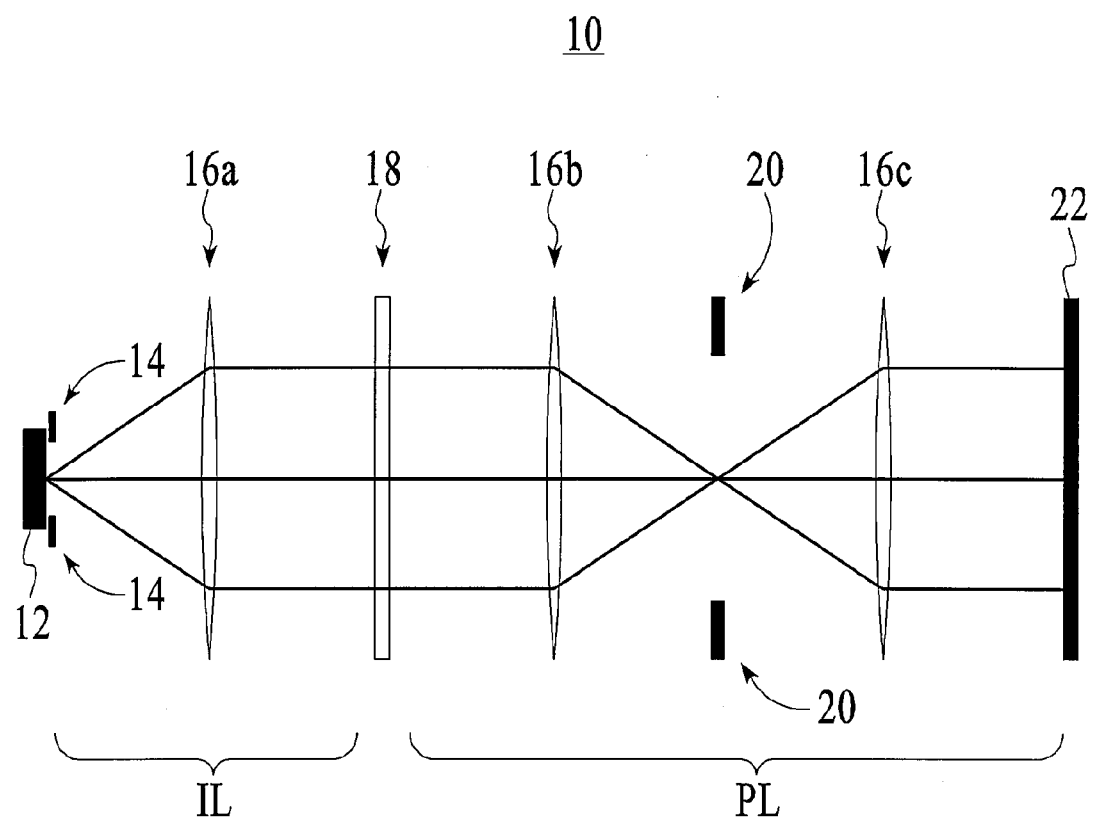
FIG. 1 is an exemplary block diagram illustrating a typical lithographic projection system.

In the drawings AI is regularly used as abbreviation for aerial image intensity (I).

DETAILED DESCRIPTION

Prior to discussing the present invention, a brief discussion regarding the overall simulation of (a part of) the lithographic process, especially the imaging process, is provided. FIG. 1 illustrates an exemplary lithographic projection system 10 of a lithographic projection apparatus in use. The exemplary lithographic exposure system 10 comprises a radiation source 12, which may be a deep-ultraviolet excimer laser source, illumination optics which define the partial coherence (denoted as sigma) and which may include specific source shaping optics (14, 16a) and projection optics (16b, 16c). An adjustable filter or aperture 20 at the pupil plane restricts the range of beam angles that impinge on the image plane 22, whereby the largest possible angle defines the numerical aperture of the projection optics NA=sin($\Theta_{max}$). In use there is a patterning device such as a mask or reticle 18 and there is a substrate, such as a wafer, at the image plane 22. The projection optics (16b, 16c, 20) are used to produce an image of a mask pattern on the patterning device at the image plane 22.

Figure 2:
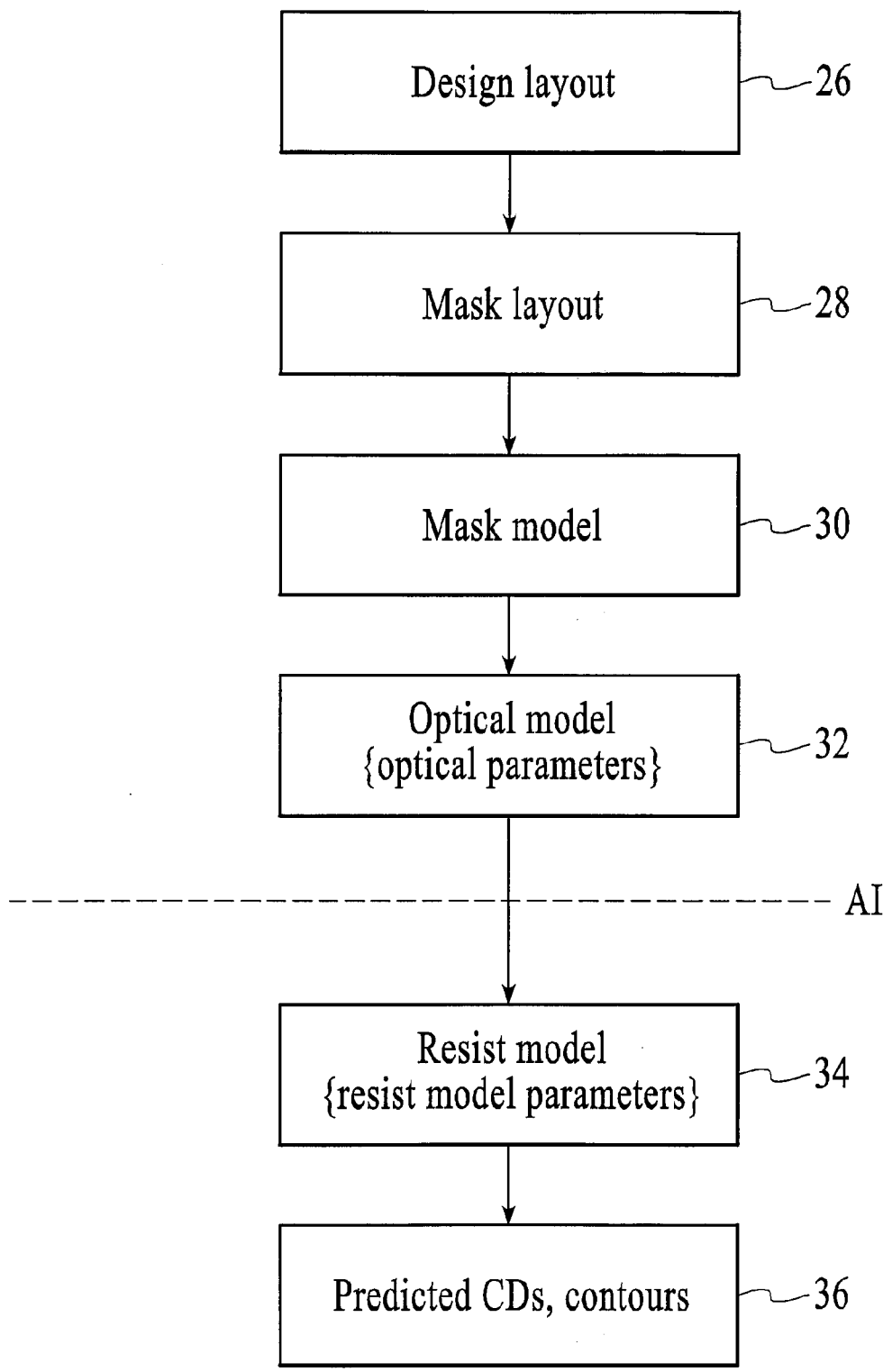
FIG. 2 is an exemplary block diagram illustrating the functional modules of a lithographic simulation model.

In a lithography simulation system, roughly, these major system components of the lithographic exposure system are modeled by corresponding separate functional modules. In FIG. 2 an example is illustrated. Referring to FIG. 2, the functional modules include a design layout module 26, which defines the target design;
a patterning device layout module such as a mask layout module 28, which defines the mask layout to be utilized in an imaging process step that will follow later;
a patterning device model module such as a mask model module 30, which models the utilization of the mask layout during the simulation process;
the optical model module 32, which defines the performance of the optical components of the modeled lithographic exposure system; and
the resist model module 34, which defines the performance of the resist being utilized in the given process.
As is known, the result of the simulation process produces, for example, predicted contours and CDs in the result module 36.

More specifically, it is noted that the properties of the illumination and projection optics are captured in the optical model module 32 that includes, but is not limited to, NA-sigma ($\sigma$) settings as well as any particular illumination source shape. The optical properties of the photo-resist layer coated on a substrate—i.e. refractive index, film thickness, propagation and polarization effects—may also be captured as part of the optical model module 32. The mask model module 30 captures the design features of the reticle and may also include a representation of detailed physical properties of the mask, as described, for example, in U.S. patent application No. 60/719,837 and in EP1941321. Finally, the resist model module 34 describes the effects of chemical processes which occur during resist exposure, PEB and development, in order to predict, for example, contours of resist features formed on the substrate wafer. The objective of a simulation using the lithography simulation system is to accurately predict, for example, edge placements and CDs, which can then be compared against the target design. The pre-OPC mask layout (i.e. the mask layout before any optimization is performed) is generally equal to the target design, and will be provided in a standardized digital file format such as GDSII or OASIS.

In general, the connection between the optical and the resist model is a simulated aerial image (AI) within a resist layer modeled to be on the substrate and in the image plane 22, which arises from the projection of radiation onto the substrate, refraction at the resist interface where the radiation enters the resist and multiple reflections in the resist layer (resist film stack). The projection radiation can for instance comprise EUV radiation between 3 and 20 nm or radiation with a wavelength of 157 or 193 nm or larger. The radiation intensity distribution of the aerial image is turned into a latent 'resist image' by absorption of photons, which is further modified by diffusion processes and various loading effects (hence the resist model module 34) into a final resist image. Efficient simulation methods that are fast enough for full-chip applications approximate the realistic 3-dimensional intensity distribution in the resist film stack by a 2-dimensional aerial (and resist) image. An efficient implementation of a lithography model is possible using the following formalism, where the aerial image intensity (here in scalar form, which may be extended to include polarization vector effects) is expressed as a Fourier sum over signal amplitudes in the pupil plane. In the implementation the aerial image intensity is expressed to depend on image of the patterning device (mask image) which itself is derived from the mask layout, then according to the standard Hopkins theory, the aerial image intensity may be defined by:

$$I(x) = \sum_k \left| A(k) \sum_{k'} M(k'-k) P(k') \exp(-jk'x) \right|^2 = \qquad \text{(Eq. 1)}$$

$$\sum_k A(k)^2 \left\{ \sum_{k'} \sum_{k''} M(k'-k) P(k') \right.$$

$$\left. M^*(k''-k) P^*(k'') \exp(-j(k'-k'')x) \right\} =$$

$$\sum_{k'} \sum_{k''} \left[ \sum_k A(k)^2 P(k+k') P^*(k+k'') \right] M(k')$$

$$M^*(k'') \exp(-j(k'-k'')x) =$$

$$\sum_{k'} \sum_{k''} TCC_{k',k''} M(k') M^*(k'') \exp(-j(k'-k'')x)$$

where, I (x) is the aerial image intensity at point x within the image plane 22 (for notational simplicity, a two-dimensional coordinate represented by a single variable is utilized), k represents a point on the source plane, A (k) is the source amplitude from point k, k' and k" are points on the pupil plane, M is the Fourier transform of the mask image), P is the pupil function, and TCC is a transmission cross coefficient, defined as $TCC_{k',k''} = \Sigma_k A(k)^2 P(k+k') P^*(k+k'')$. An important aspect of the foregoing derivation is the change of summation order (moving the sum over k inside) and indices (replacing k' with k+k' and replacing k" with k+k"), which results in the separation of the Transmission Cross Coefficients (TCCs), defined by the term inside the square brackets in the third line in the equation. These coefficients are independent of the mask pattern and therefore can be pre-computed using knowledge of the optical elements or configuration only (e.g., NA and $\sigma$ or the detailed illuminator profile). It is further noted that although in the given example the aerial image intensity I(x) in (Eq.1) is derived from a scalar imaging model, this formalism can also be extended to a vector imaging model, where TE and TM polarized radiation components are summed separately.

Furthermore, the aerial image intensity can be approximated by using only a limited number of dominant TCC terms, which can be determined by diagonalizing the TCC matrix and retaining the terms corresponding to its largest eigenvalues, i.e., $$TCC_{k',k''} = \sum_{i=1}^{N} \lambda_i \phi_i(k') \phi_i^*(k'') \quad \text{(Eq. 2)}$$

where $\lambda_i (i=1, \ldots, N)$ denotes the N largest eigenvalues and $\phi_i(\cdot)$ denotes the corresponding eigenvector of the TCC matrix. It is noted that (Eq.2) is exact when all terms are retained in the eigenseries expansion, i.e., when N is equal to the rank of the TCC matrix. However, in actual applications, it is typical to truncate the series by selecting a smaller N to increase the speed of the computation process.
Thus (Eq.1) can be rewritten as:

$$I(x) = \sum_{k'} \sum_{k''} TCC_{k',k''} M(k') M^*(k'') \exp(-j(k'-k'')x) = \quad \text{(Eq. 3)}$$

$$\sum_{k'} \sum_{k''} \sum_{i=1}^{N} \lambda_i \phi_i(k') \phi_i^*(k'') M(k') M^*(k'') \exp(-j(k'-k'')x) =$$

$$\sum_{i=1}^{N} \lambda_i \sum_{k'} \phi_i(k') M(k') \exp(-jk'x)$$

$$\sum_{k''} \phi_i^*(k'') M^*(k'') \exp(jk''x) = \sum_{i=1}^{N} \lambda_i |\Phi_i(x)|^2$$

where $$\Phi_i(x) = \sum_{k''} \phi_i(k'') M(k'') \exp(-jk''x)$$

and $|\cdot|$ denotes the magnitude of a complex number.

Using a sufficiently large number of TCC terms and a suitable model calibration methodology allows for a sufficiently accurate description of the optical projection process and provides for 'separability' of the lithographic simulation model into the optics and resist models or parts. In an ideal, separable model, all optical effects such as NA, sigma, defocus, aberrations etc. are accurately captured in the optical model module, while chemical processes are simulated by the resist model. In practice, however, all 'efficient' lithographic simulation models (as opposed to first-principle models, which are generally too slow and require too many adjustable parameters to be practical for full-chip simulations) are empirical to some extent and will use a limited set of parameters. There may in some cases be 'lumped' parameters that account for certain combined net effects of both optical and chemical resist properties. For example, diffusion processes during PEB of resist can be modeled by a Gaussian filter that blurs the image formed in resist, while a similar filter might also describe the effect of stray radiation, stage vibration, or the combined effect of high-order aberrations of the projection system. Lumped parameters can reproduce process behavior close to fitted calibration points, but will have inferior predictive power compared with separable models when used to adjust the lithographic process. This can easily be understood as in the example above changing the projection system aberrations based on the lumped parameter may be detrimental as the lumped parameter does not only represent the projection system aberrations but also the stage vibration. Separability typically requires a sufficiently detailed model form—in the example above, e.g., using 2 independent filters for optical blurring and resist diffusion—as well as a suitable calibration methodology that assures isolation of optical effects from chemical resist effects.

While a separable model may generally be preferred for most applications, it is noted that the description of through-process window aerial image variations set forth below does not require strict model separability. Methods for adapting a general resist model in order to accurately capture through-PW variations are also provided in U.S. patent application No. 60/992,546 and Ser. No. 12/315,849 assigned to Brion Technologies. In addition, the TCC can be approximated by a polynomial for each process window or generalized process window coordinates, such as focus, exposure dose, NA, etc. For each coordinate, the polynomial coefficients correspond to the derivative TCC matrices with respect to that process window coordinate, as also described in U.S. patent application No. 60/992,546 and Ser. No. 12/315,849.

As explained in further detail below, the objective of the illumination optimization process of the present invention is, for a given target design, to generate an illumination pattern such that the resulting aerial image (AI) has the largest process window (PW) or best Design For Manufacturing (DFM) metrics (including for example but not limited to MEEF (Mask Error Enhancement Factor), derivative of CD vs. process window parameters, or the local aerial image intensity slope). The illumination optimization process of the present invention utilizes a programmable illuminator mask and determines optimal patterns for the illuminator mask according the target design. The utilization of the programmable mask also allows for the derivation of most general shaped illuminators. Alternatively a free form diffractive optical element (DOE) is utilized. Prior to discussing the details of the illuminator optimization method, a discussion regarding simulation and modeling of the lithography process is provided.

Series Expansion/Polynomial Fitting of Derivative Images

The purpose of lithography simulations in the context of OPC applications and OPC/RET verification is an accurate prediction of printed line widths and placement of resist contours by simulating the image projection process and resist development phenomena using calibrated optical and (post-exposure) process models. One aspect of the current method is to replace a multitude of individual simulations for a given mask layout at many different parameter settings that sparsely cover a process window by a very limited number of simulations for that mask layout, and to parameterize the through-process window changes in a way that allows dense coverage by smooth interpolation at any arbitrary point in the process window.

The basic approach of the method can be understood by considering through-focus changes in resist line width (or edge placement) of a generic resist line. It is well known that the CD of the resist line typically has a maximum or minimum value at best focus, but the CD varies smoothly with defocus in either direction. Therefore, the through-focus CD variations of a particular feature may be approximated by a polynomial fit of CD vs. defocus, e.g. a second-order fit for a sufficiently small defocus range. However, the direction and magnitude of change in CD will depend strongly on the resist threshold (dose to clear), the specific exposure dose, feature type, and proximity effects. Thus, exposure dose and through-focus CD changes are strongly coupled in a non-linear manner that prevents a direct, general parameterization of CD or edge placement changes throughout the process window space.

However, the aerial image intensity (I) is also expected to show a continuous variation through focus. Every mask point may be imaged to a finite-sized spot in the image plane (22) that is characterized by the point spread function of the projection system. This spot will assume a minimum size at best focus but will continuously blur into a wider distribution with both positive and negative defocus. Therefore, it is possible to approximate the variation of aerial image intensity (I) through focus as a second-order polynomial for each individual image point within the exposure field:

$$I(x,f) = I_0(x) + a(x) \cdot (f-f_0) + b(x) \cdot (f-f_0)^2 \quad \text{(Eq.4)}$$

where $f_0$ indicates the nominal or best focus position, and f is the actual focus level at which the image I is calculated. The second-order approximation is expected to hold well for a sufficiently small defocus range, but the accuracy of the approximation may easily be improved by including higher-order terms if required (for example, $3^{rd}$ order and/or $4^{th}$ order terms). In fact, (Eq.4) can also be identified as the beginning terms of a Taylor series expansion of the aerial image around the nominal best focus plane:

$$I(x, f) = I(x, f_0) + \frac{\partial I(x, f)}{\partial f}\bigg|_{f=f_0} \cdot (f - f_0) + 2\frac{\partial^2 I(x, f)}{\partial f^2}\bigg|_{f=f_0} \cdot (f - f_0)^2 \quad \text{(Eq. 5)}$$

which can in principle be extended to an arbitrarily sufficient representation of the actual through-focus behavior of the aerial image intensity (I) by including additional higher-order terms. It is noted that the choice of polynomial base functions is only one possibility to express a series expansion of the aerial image intensity through focus, and the methods are by no means restricted to this embodiment, e.g., the base functions can be special functions such as Bessel Functions, Legendre Functions, Chebyshev Functions, Trigonometric functions, and so on. In addition, while the process window term is most commonly understood as spanning variations over defocus and exposure dose, the process window concept can be generalized and extended to cover additional or alternative parameter variations, such as variation of NA and sigma, etc.

Comparison of (Eq.4) and (Eq.5) reveals the physical meaning of the parameters "a" and "b" as first and second-order image intensity derivatives. These may in principle be determined directly as derivatives by a finite difference method for every image point and entered into (Eq.4) and (Eq.5) to interpolate the image variations. Alternatively, in order to improve the overall agreement between the interpolation and the actual through focus variation over a wider range, the parameters a and b can be obtained from a fit using the least squares criterion of (Eq.4) over a number L of focus positions $\{f_1, f_2, \ldots, f_L\}$ for which aerial image intensities are explicitly calculated as $\{I_1, I_2, \ldots, I_L\}$. The parameters "a" and "b" are then found as solutions to the following system of equations when applying the least squares criterion (assuming here that L>3, in which case the system of equations is over-determined).

Without loss of generality, it is assumed that $f_0=0$ so as to simplify the notation. Then for a fixed image point (x), $$\begin{aligned} I_1 &= I_0 + a \cdot f_1 + b \cdot f_1^2 \\ I_2 &= I_0 + a \cdot f_2 + b \cdot f_2^2 \\ &\ldots \\ I_L &= I_0 + a \cdot f_L + b \cdot f_L^2 \end{aligned} \quad \text{(Eq. 6)}$$

where $I_0$ is the aerial image intensity at nominal conditions (NC), i.e. $f=f_0$. The solution to the above set of equations minimizes the following sum of squared differences (G), with the index l referring to the L different focus conditions:

$$G = \sum_{l=1}^{L} W_l \cdot (I_l - I_0 - a \cdot f_l - b \cdot f_l^2)^2 \quad \text{(Eq. 7)}$$

where $W_l$ is a user-assigned weight to defocus $f_l(l=1, 2, \ldots, L)$. By using the set of user-assigned weights $\{W_1, W_2, \ldots, W_L\}$, it is possible to assign different weights to different focuses. For example, in order to make the $2^{nd}$ order polynomial approximation have a better match at process window points closer to nominal conditions, it is possible to assign a larger weight close to nominal conditions and a smaller weight away from nominal conditions; or if it is desired for all focus points to have equal importance, one can simply assign equal weights, i.e., $W_1=W_2=\ldots=W_L=1$. For large deviations in focus and dose relative to the nominal condition, many patterns become unstable in printing and the measurements of CDs become unreliable, in such cases it may be desirable to assign small weights to such process window conditions.

To solve (Eq.7), it is noted that the best fit will fulfill the conditions:

$$\frac{\partial G}{\partial a} \equiv 0, \quad \text{and} \quad \frac{\partial G}{\partial b} \equiv 0 \quad \text{(Eq. 8)}$$

(Eq.8) can be solved analytically, resulting in immediate expressions for "a" and "b" as the linear combination or weighted sum of the aerial image intensities ($I_l$) per focus condition, as shown below. The coefficients of this linear combination do not depend on the pixel coordinate or pattern, but only on the values of the focus conditions ($f_l$) and the user-assigned weights ($W_l$). As such, these coefficients can be understood as forming a linear filter for the purpose of interpolation in the space of focus condition (f), and the particular choice of polynomials as base functions gives rise to the specific values of the coefficients, independent of the mask pattern. More specifically, the calculation of these coefficients is performed once the values of focus condition ($f_l$) and user assigned-weights ($W_l$) are determined, without knowing the specific optical exposure settings or actually carrying out aerial image simulations.

With regard to solving (Eq.8), (Eq.7) can be rewritten as:

$$\begin{aligned} G &= \sum_{l=1}^{L} W_l \cdot (I_l - I_0 - a \cdot f_l - b \cdot f_l^2)^2 \\ &= \sum_{l=1}^{L} W_l \cdot (b \cdot f_l^2 + a \cdot f_l - \Delta I_l)^2 \end{aligned}$$

where $\Delta I_l = I_l - I_0$ for $l = 1, 2, \ldots, L$.

As a result, (Eq.8) can be expanded as:

$$\frac{\partial G}{\partial a} = \sum_{l=1}^{L} W_l \cdot 2(b \cdot f_l^2 + a \cdot f_l - \Delta I_l) \cdot f_l$$

$$= 2a \cdot \sum_{l=1}^{L} W_l \cdot f_l^2 + 2b \cdot \sum_{l=1}^{L} W_l \cdot f_l^3 - 2 \cdot \sum_{l=1}^{L} W_l \cdot \Delta I_l \cdot f_l$$

$$= 2a \cdot \alpha_2 + 2b \cdot \alpha_3 - 2\Phi_1$$

$$\equiv 0$$

$$\frac{\partial G}{\partial b} = \sum_{l=1}^{L} W_l \cdot 2(b \cdot f_l^2 + a \cdot f_l - \Delta I_l) \cdot f_l^2$$

$$= 2a \cdot \sum_{l=1}^{L} W_l \cdot f_l^3 + 2b \cdot \sum_{l=1}^{L} W_l \cdot f_l^4 - 2 \cdot \sum_{l=1}^{L} W_l \cdot \Delta I_l \cdot f_l^2$$

$$= 2a \cdot \alpha_3 + 2b \cdot \alpha_4 - 2\Phi_2$$

$$\equiv 0$$

Thus:

$$a = \frac{\alpha_4 \Phi_1 - \alpha_3 \Phi_2}{\alpha_2 \alpha_4 - \alpha_3^2}$$

$$= \sum_{l=1}^{L} h_{al} \Delta I_l$$

$$= \sum_{l=1}^{L} h_{al}(I_l - I_0),$$

$$b = \frac{\alpha_2 \Phi_2 - \alpha_3 \Phi_1}{\alpha_2 \alpha_4 - \alpha_3^2}$$

$$= \sum_{l=1}^{L} h_{bl} \Delta I_l$$

$$= \sum_{l=1}^{L} h_{bl}(I_l - I_0)$$

where $$\alpha_2 = \sum_{l=1}^{L} W_l \cdot f_l^2,$$

$$\alpha_3 = \sum_{l=1}^{L} W_l \cdot f_l^3,$$

$$\alpha_4 = \sum_{l=1}^{L} W_l \cdot f_l^4,$$

$$\Phi_1 = \sum_{l=1}^{L} W_l \cdot \Delta I_l \cdot f_l,$$

$$\Phi_2 = \sum_{l=1}^{L} W_l \cdot \Delta I_l \cdot f_l^2,$$

$$h_{al} = \frac{W_l \cdot f_l \cdot (\alpha_4 - \alpha_3 \cdot f_l)}{\alpha_2 \alpha_4 - \alpha_3^2},$$

$$h_{bl} = \frac{W_l \cdot f_l \cdot (\alpha_2 \cdot f_l - \alpha_3)}{\alpha_2 \alpha_4 - \alpha_3^2}$$

(Eq. 9)

Note that:

$$\sum_{l=1}^{L} [h_{al} \cdot f_l] = \frac{\alpha_4 \cdot \sum_{l=1}^{L} [W_l \cdot f_l^2] - \alpha_3 \cdot \sum_{l=1}^{L} [W_l \cdot f_l^3]}{\alpha_2 \alpha_4 - \alpha_3^2}$$

$$= \frac{\alpha_4 \alpha_2 - \alpha_3^2}{\alpha_2 \alpha_4 - \alpha_3^2}$$

$$= 1$$

$$\sum_{l=1}^{L} [h_{al} \cdot f_l^2] = \frac{\alpha_4 \cdot \sum_{l=1}^{L} [W_l \cdot f_l^3] - \alpha_3 \cdot \sum_{l=1}^{L} [W_l \cdot f_l^4]}{\alpha_2 \alpha_4 - \alpha_3^2}$$

$$= \frac{\alpha_4 \alpha_3 - \alpha_3 \alpha_4}{\alpha_2 \alpha_4 - \alpha_3^2}$$

$$= 0$$

$$\sum_{l=1}^{L} [h_{bl} \cdot f_l] = \frac{\alpha_2 \cdot \sum_{l=1}^{L} [W_l \cdot f_l^3] - \alpha_3 \cdot \sum_{l=1}^{L} [W_l \cdot f_l^2]}{\alpha_2 \alpha_4 - \alpha_3^2}$$

$$= \frac{\alpha_2 \alpha_3 - \alpha_3 \alpha_2}{\alpha_2 \alpha_4 - \alpha_3^2}$$

$$= 0$$

$$\sum_{l=1}^{L} [h_{bl} \cdot f_l^2] = \frac{\alpha_2 \cdot \sum_{l=1}^{L} [W_l \cdot f_l^4] - \alpha_3 \cdot \sum_{l=1}^{L} [W_l \cdot f_l^3]}{\alpha_2 \alpha_4 - \alpha_3^2}$$

$$= \frac{\alpha_2 \alpha_4 - \alpha_3^2}{\alpha_2 \alpha_4 - \alpha_3^2}$$

$$= 1$$

(Eq. 10)

As is made clear below, this property will be useful in the resist model section. The above set of equations can also be readily generalized to accommodate a higher-order polynomial fitting.

The benefit of introducing the aerial image intensity derivatives "a" and "b" is that using (Eq.4), the aerial image intensity can be predicted at any point of the process window by straightforward scaling of the a and b aerial image intensities by the defocus offset and a simple addition, rather than performing a full image simulation (i.e., convolution of the mask pattern with the TCCs) at each particular defocus setting required for a process window analysis. In addition, changes in exposure dose can be expressed by a simple upscaling or downscaling of the aerial image intensity by a factor $(1+\epsilon)$:

$$I(x,f,1+\epsilon) = (1+\epsilon) \cdot (x,f) \quad \text{(Eq.11)}$$

where $I(x,f)$ is the aerial image at the nominal exposure dose, while $\epsilon$ is the relative change in dose.

Combining this with (Eq.4) yields the general result:

$$I(x, f, 1+\varepsilon) = (1+\varepsilon) \cdot [I_0(x) + a(x) \cdot (f-f_0) + \quad \text{(Eq. 12)}$$

$$b(x) \cdot (f-f_0)^2]$$

$$= I_0(x) + [\varepsilon \cdot I_0(x) + (1+\varepsilon) \cdot a(x) \cdot (f-f_0) +$$

$$(1+\varepsilon) \cdot b(x) \cdot (f-f_0)^2]$$

$$= I_0(x) + \Delta I(x)$$

where $\Delta I$ will typically represent small perturbations within a reasonable range of process window parameter variations.

Figure 3:
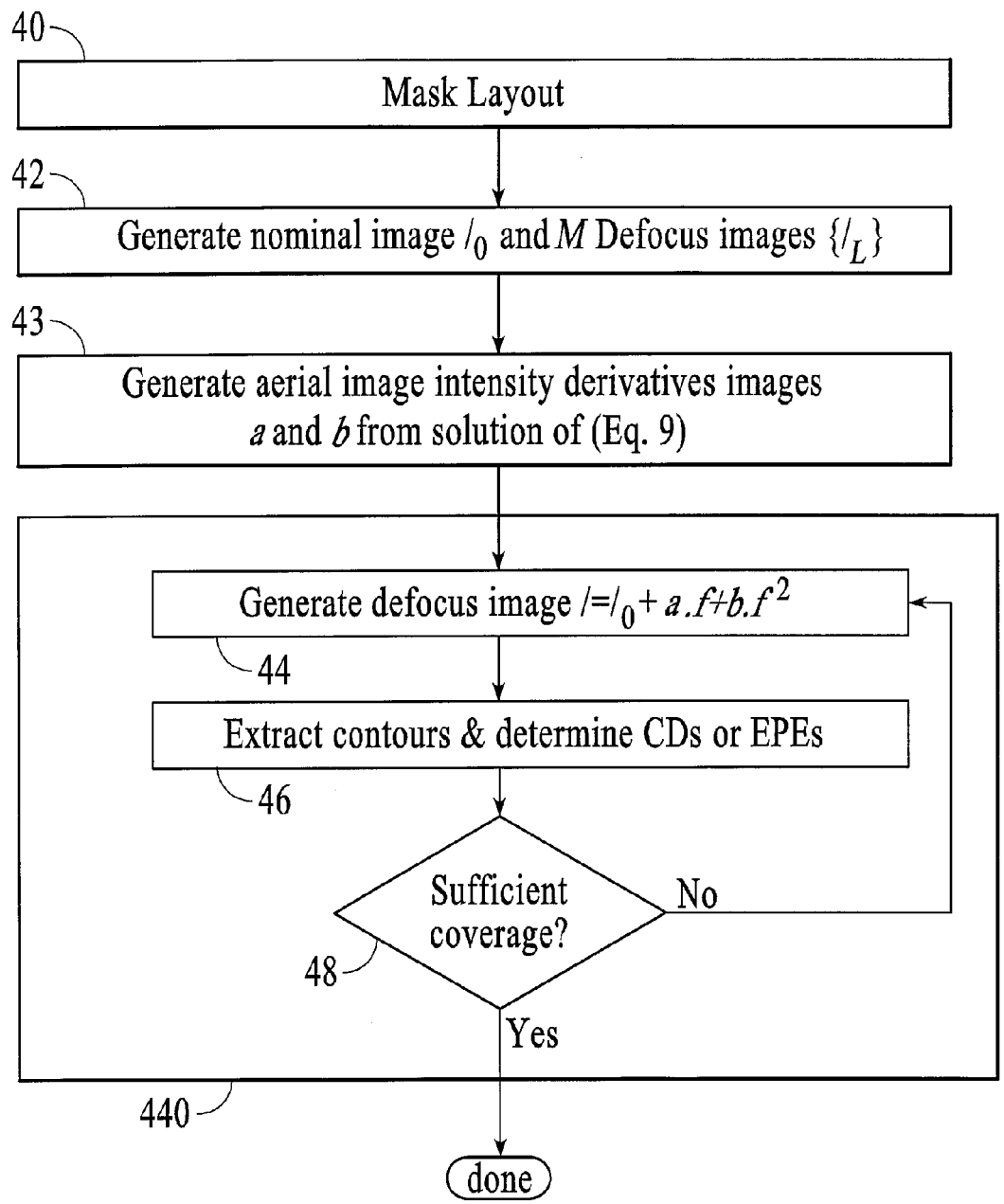
FIGS. 3-5 illustrate exemplary flowcharts regarding methods of simulating imaging performance which account for process variations associated with a given lithography process.

The foregoing method is exemplified by a flow diagram in FIG. 3 where the contours, CD or Edge Placement Errors (EPEs) are to be extracted from the aerial image at different defocus conditions. Referring to FIG. 3, the first step (Step 40) in the process is to identify the target design (or (pre-OPC) mask layout) and the process conditions to be utilized. The next step (Step 42) is to generate a nominal aerial image intensity $I_O$ and L aerial images intensities $\{I_l\}$ at different focus conditions in accordance with (Eq.3) above. Thereafter, derivative images "a" and "b" are generated utilizing (Eq.9) (Step 43). Then step 440 covers the process window analysis comprising steps 44, 46 and 48. Step (Step 44) entails generating the defocus image utilizing (Eq.4), i.e., the synthesis of $I_0$, a (scaled by f) and b (scaled by $f^2$). Next, contours are extracted and CDs or feature EPEs are determined from the simulated image (Step 46). The process then proceeds to Step 48 to determine whether or not there is sufficient coverage (e.g., whether it is possible to determine the boundary of the process window) and if the answer is no, the process returns to Step 44 and repeats the foregoing process. If there is sufficient coverage, the process is complete.

It is noted that
if a sufficient coverage of the process window requires evaluation at a number of process window points, and
if the number of images at different focus conditions L used for fitting the derivative images a and b is smaller than that number of process window points,
the reduction in computation time will be close to the number of images at different focus conditions L divided by the number of process window points to be evaluated. This is because since scaling the predetermined images $I_0$, a and b requires significantly less computation time than an independent re-calculation of the projected image at each new parameter setting. The foregoing method is generally applicable, independent of the specific details of the aerial image simulation. Furthermore, it is also applicable to both the aerial image as well as to the resist image from which simulated resist contours are extracted.

The foregoing method also does not depend on any specific model or implementation used for simulating the set of aerial image intensities $\{I_1, I_2, \ldots, I_L\}$ at varying defocus. However, the foregoing method requires a number L>2 of individual images to be simulated for each mask layout under consideration. In a second embodiment of the method of the present invention, an even more efficient solution is made possible by the TCC formalism introduced in (Eq.1).

Whereas the aerial image intensity is expressed in focus (because in the image plane 22) in Equation 1, the transmission cross coefficients in this embodiment encompass the focus condition completely. (Without that the mask image M in the Fourier domain would have to be modelled differently for different focus conditions.) In this embodiment in a modified version of Eq 1, each aerial image intensity at focus $f_l$ (l=0, 1, . . . , L) is defined as: $I_l(x) = \Sigma_{k'}\Sigma_{k''}TCC_{l,k',k''}M(k')M^*(k'')\exp(-j(k'-k'')x)$ where $TCC_l$ is the TCC at focus condition $f_l$ and $TCC_{l,k',k''}$ is the matrix element of $TCC_l$, and $M(\cdot)$ represents the mask image (in the Fourier domain), which is independent of the focus.

Combining this with (Eq.9) and exchanging the order of summation, $$a = \sum_{l=1}^{L} h_{al}(I_l - I_0) \qquad \text{(Eq. 13)}$$

$$= \sum_{l=1}^{L} h_{al}(\sum_{k'}\sum_{k''} TCC_{l,k',k''} M(k')M^*(k''))$$

$$\exp(-j(k'-k'')x) - \sum_{k'}\sum_{k''} TCC_{0,k',k''} M(k')M^*(k'')$$

$$\exp(-j(k'-k'')x)$$

$$= \sum_{k'}\sum_{k''} \left[\sum_{l=1}^{L} h_{al}(TCC_{l,k',k''} - TCC_{0,k',k''})\right]$$

$$M(k')M^*(k'')\exp(-j(k'-k'')x)$$

$$b = \sum_{l=1}^{L} h_{bl}(I_l - I_0)$$

$$= \sum_{l=1}^{L} h_{bl}(\sum_{k'}\sum_{k''} TCC_{l,k',k''} M(k')M^*(k''))$$

$$\exp(-j(k'-k'')x) - \sum_{k'}\sum_{k''} TCC_{0,k',k''} M(k')M^*(k'')$$

$$\exp(-j(k'-k'')x)$$

$$= \sum_{k'}\sum_{k''} \left[\sum_{l=1}^{L} h_{bl}(TCC_{l,k',k''} - TCC_{0,k',k''})\right]$$

$$M(k')M^*(k'')\exp(-j(k'-k'')x)$$

Thus, if two new TCCs are defined as linear combinations of the focus dependent $TCC_l$ (l=0, 1, . . . , L) in the following way:

$$A = \sum_{l=1}^{L} h_{al}\Delta TCC_l = \sum_{l=1}^{L} h_{al}(TCC_l - TCC_0), \qquad \text{(Eq. 14)}$$

$$B = \sum_{l=1}^{L} h_{bl}\Delta TCC_l = \sum_{l=1}^{L} h_{bl}(TCC_l - TCC_0)$$

then "a" and "b" are aerial image intensity derivatives which can be computed directly from A and B like "derivative images", i.e., $$a(x) = \sum_{k'}\sum_{k''} A_{k',k''} M(k')M^*(k'')\exp(-j(k'-k'')x) \qquad \text{(Eq. 15)}$$

$$b(x) = \sum_{k'}\sum_{k''} B_{k',k''} M(k')M^*(k'')\exp(-j(k'-k'')x)$$

where $$A_{k',k''} = \sum_{l=1}^{L} h_{al}(TCC_{l,k',k''} - TCC_{0,k',k''}) \text{ and}$$

$$B_{k',k''} = \sum_{l=1}^{L} h_{bl}(TCC_{l,k',k''} - TCC_{0,k',k''})$$

are the matrix elements of A and B, respectively.

This also implies that a linear combination of aerial image intensities of different planes can be computed using a single linear combination of TCCs corresponding to those planes.

A significant advantage of using $TCC_0$, A, and B in place of the L through-focus images is that the $TCC_0$, A, and B can be pre-computed, independently of the actual mask pattern (mask layout), for known illumination and projection parameters, giving rise to the possibility of further reduction of computing time (down from L through-focus simulations for each mask pattern (mask layout)). This is because the TCC for the image plane 22 ($TCC_0$) is determined without knowledge of the actual mask pattern. The effect of the focus condition is modeled to be in the transmission cross coefficient and the Fourier coefficient of the mask image is modeled to be independent of the focus condition. It will be clear to the skilled person that other variants are possible as well. In an analogue way, the generation of A and B neither requires computation of a set of aerial image intensities at different defocus conditions nor requires calibration from this set of aerial image intensities. Once $TCC_0$, A, and B have been calculated, these terms can be generally applied to predict the through-focus imaging performance for any specific mask layout using (Eq.15) and (Eq.4). Besides the through-focus variation, a variation of exposure dose around nominal condition can be applied to the TCC terms by the same linear scaling as already described by (Eq.11) and (Eq.12) above.

Calculating the derivative images a and b from TCCs, A and B allows a further reduction of computation time by using only the dominant terms of A and B, as in the discussions related to (Eq.2). More specifically, assuming the diagonalization of $TCC_0$, A and B is:

$$TCC_0 = \sum_{i=1}^{N_0} \lambda_{0,i} \phi_{0,i}(k') \phi_{0,i}(k'') \quad \text{(Eq. 16)}$$

$$A = \sum_{i=1}^{N_A} \lambda_{A,i} \phi_{A,i}(k') \phi_{A,i}(k'')$$

$$B = \sum_{i=1}^{N_B} \lambda_{B,i} \phi_{B,i}(k') \phi_{B,i}(k'')$$

where $\lambda_{0,i}$ ($i=1, \ldots, N_0$) denotes the $N_0$ largest eigenvalues and $\phi_{0,i}(\bullet)$ denotes the corresponding eigenvector of the TCC matrix $TCC_0$; $\lambda_{A,i}$ ($i=1, \ldots, N_A$) denotes the $N_A$ largest eigenvalues and $\phi_{A,i}(\bullet)$ denotes the corresponding eigenvector of the TCC matrix A; and $\lambda_{B,i}$ ($i=1, \ldots, N_B$) denotes the $N_B$ largest eigenvalues and $\phi_{B,i}(\bullet)$ denotes the corresponding eigenvector of the TCC matrix B.

Then, from (Eq.3), for mask image $M(\bullet)$, $$I_0(x) = \sum_{i=1}^{N_0} \lambda_{0,i} |\Phi_{0,i}(x)|^2 \quad \text{(Eq. 17)}$$

$$a(x) = \sum_{i=1}^{N_A} \lambda_{A,i} |\Phi_{A,i}(x)|^2$$

$$b(x) = \sum_{i=1}^{N_B} \lambda_{B,i} |\Phi_{B,i}(x)|^2$$

where $I_0$ is the nominal aerial image, $$\Phi_{0,i}(x) = \sum_{k''} \phi_{0,i}(k'') M(k'') \exp(-jk''x),$$

$$\Phi_{A,i}(x) = \sum_{k''} \phi_{A,i}(k'') M(k'') \exp(-jk''x) \text{ and}$$

$$\Phi_{B,i}(x) = \sum_{k''} \phi_{B,i}(k'') M(k'') \exp(-jk''x).$$

Utilizing a larger number of TCC terms generally improves the accuracy of the optical model and the separability of optical and resist model components (as explained previously). However, since the image or TCC derivatives relate to relatively minor image variations within the process window, typically on the order of 10% in CD variation, a smaller number of terms may suffice for the A and B terms than for the Nominal Condition $TCC_0$. For example, if 64 terms are considered for $TCC_0$, (i.e., $N_0$=64), only 32 terms are typically required for each of the A and B terms in order to achieve sufficient CD prediction accuracy, i.e., $N_A = N_B = 32$. In this case, approximately the same amount of computation time will be required to generate the derivative images a and b as compared to the nominal condition $I_0$. It is noted that, unlike the original TCC matrices, a coefficient TCC matrix such as A or B is in general not non-negative-definite, which implies both positive and negative eigenvalues exist for a derivative TCC matrix. Therefore, the leading terms from the eigen value expansion and truncation should include all eigenvalues with the largest absolute values, both positive and negative.

Similar to (Eq.5), (Eq.14) can be derived alternatively from series expansion. More specifically, the variation of TCC matrix elements around nominal or best focus $f_o$ may also be expressed as a series expansion:

$$TCC_{k',k''}(f) = TCC_{k',k''}(f_0) + \left. \frac{\partial TCC_{k',k''}(f)}{\partial f} \right|_{f=f_0} \cdot (f-f_0) + \quad \text{(Eq. 18)}$$

$$2 \left. \frac{\partial^2 TCC_{k',k''}(f)}{\partial f^2} \right|_{f=f_0} \cdot (f-f_0)^2$$

Thus, the coefficients of the series expansion may be evaluated directly by a numerical finite difference method, or again from a fit using the least-squares criterion to a number of individually calculated TCC terms corresponding to a set of focus positions, in a manner similar to the through-focus fitting of aerial images discussed above. The fitting approach provides a wider range of validity, and introduces weight factors to place more or less emphasis on certain parts of the process window. This approach will follow (Eq.6)-(Eq.9) after replacing the set of test images $I_l$ by their corresponding TCCs in the equations.

Consequently, the best fit derivative matrices A and B are obtained from the same linear combination set forth above, also after formally replacing the $I_l$ by $TCC_l$:

$$A = \sum_{l=1}^{L} h_{al} \Delta TCC_l \quad \text{(Eq. 19)}$$

$$= \sum_{l=1}^{L} h_{al} \Delta (TCC_l - TCC_0),$$

$$B = \sum_{l=1}^{L} h_{bl} \Delta TCC_l$$

$$= \sum_{l=1}^{L} h_{bl} \Delta (TCC_l - TCC_0)$$

where $h_{al}$ and $h_{bl}$ are again computed using (Eq.9). It is noted that $h_{al}$ and $h_{bl}$ are constants that do not depend on the patterns or $TCC_l$. Thus, A and B are simply a linear combination of the TCC at the nominal condition (here in focus) ($TCC_0$) and a set of TCC's at various defocus conditions ($TCC_1$ through $TCC_L$).

Note that (Eq.19) is the same as (Eq.14), thus these two alternative approaches lead to the same final formulation. Similarly, (Eq.4) can also be derived from (Eq.15), (Eq.18), and (Eq.19).

Figure 4:
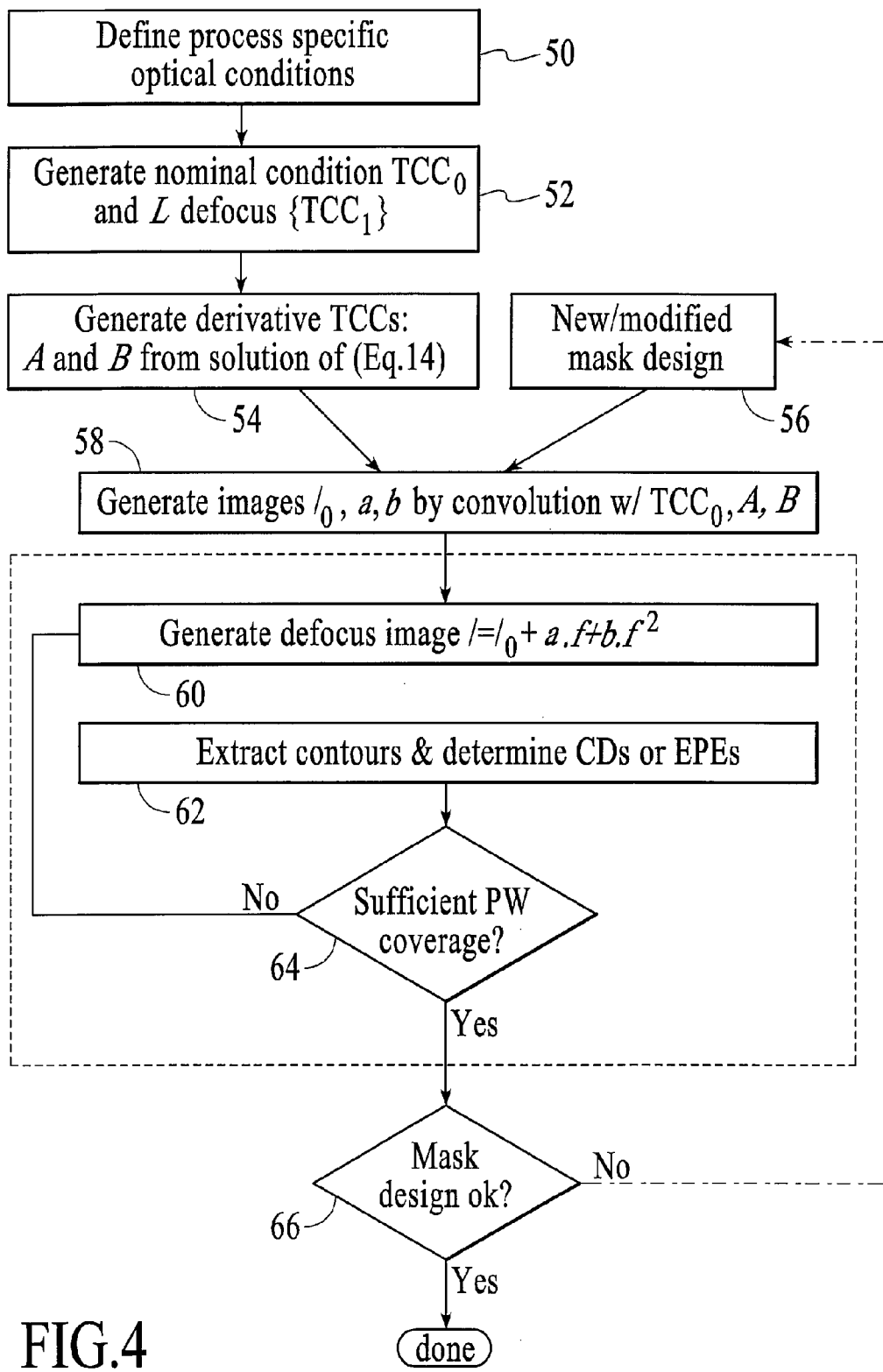

The method of the second embodiment is exemplified by the flow diagram in FIG. 4 where the contours, CD or Edge Placement Errors (EPEs) are to be extracted from the aerial image at different defocus conditions. The first step (Step 50) in the process is to identify the process specific optical conditions associated with the desired process. The next step (Step 52) is to generate a nominal condition $TCC_O$ and a set $\{TCC_l\}$ of transmission cross coefficients at a number L of defocus positions. Thereafter, the derivative TCCs (A,B) are generated utilizing (Eq.14) (Step 54). The next step (Step 58) generates images $I_0$, a, b by convolution of the mask image with $TCC_0$, A and B utilizing (Eq.17). Next, for each mask design (Step 56), defocus image is synthesized utilizing (Eq.4) (Step 60), thereby generating the simulated image. Next, contours are extracted and CDs or feature EPEs are determined from the simulated image (Step 62). The process then proceeds to Step 64 to determine whether or not there is sufficient coverage to determine the boundary of the process window and if the answer is no, the process returns to Step 58 and repeats the foregoing process at a different focus condition. If there is sufficient coverage, the process proceeds to Step 66 to determine if the image produced by the mask design is within allowable error tolerances, and if so, the process is complete. If not, the process returns to Step 56 so as to allow for adjustment and redesign of the mask. It is noted that this last step is an optional step in the process.

In the flowchart of FIG. 4, the diagram shows the process window analysis embedded within a 'mask variation loop' which may be required, in particular, for iterative, process window-aware OPC modifications of an initial mask design. In this situation, any improvement in computation speed for the through-process window image assessment will be especially beneficial.

In an embodiment, additional reduction in computation time are be achieved by further suitable assumptions or a priori knowledge about the physics of the optical system. For example, in the absence of strong aberrations, it can be expected that the through-focus variation of aerial image intensities will be an even (i.e. symmetrical) function of defocus. Therefore, it can be expected that the first-order derivatives "A" and "a" will be negligible under these conditions.

This simplification can be further justified by noting that the effect of defocus corresponds to a multiplication of the pupil function by a phase factor $p=p_0 \exp[ja(f-f_0)^2]$, where the nominal focus is at $f_0=0$. For small defocus the phase shift can be approximated by a Taylor expansion: $p=p_0 \cdot [1+ja(f-f_0)^2]$, which does not contain a linear term.

All the above methods may also be extended to a generalized process window definition that can be established by different or additional base parameters in addition to exposure dose and defocus. These may include, but are not limited to, optical settings such as NA, sigma, aberrations, polarization, or optical constants of the resist layer (whose effects on the imaging process are included in the optical model, i.e. the TCCs). As one example, including a variation of NA around nominal conditions, the aerial image intensity can be expressed as:

$$I(f,NA) = I_0 + a \cdot (f-f_0) + b \cdot (f-f_0)^2 + c \cdot (NA-NA_0) + d \cdot (NA-NA_0)^2 + e \cdot (f-f_0) \cdot (NA-NA_0) \quad (Eq.20)$$

where I, $I_0$, a, ..., e are 2-dimensional images and image derivatives, respectively. The additional parameters "c", "d", and "e" can be determined by a fit using the least squares criterion to a set of simulated images or a set of simulated TCCs at varying parameter values for f and NA, while the scaling with exposure dose as in (Eq.11) and (Eq.12) still applies. It is noted that, similar to (Eq.9), these parameters (a, b, c, d, and the cross-term coefficient e) are again a linear combination of aerial image intensities $\{I_l\}$. The coefficients of this linear combination do not depend on the pixel coordinate or pattern, but only on the values of the $\{f_l\}$, $\{NA_l\}$, and/or the user-assigned weights $\{W_l\}$.

For this generalized process window model, simplifications based on physical insight are also possible. In case of NA variations, for example, it can be expected that these will have a rather monotonous, linear effect on the image variations, in which case (Eq.20) can be simplified by dropping the higher order "d" and "e" terms in NA, possibly in addition to the linear term in defocus. Also, for any generalized process window definition, the number of TCC terms used for calculating $I_0$ at the nominal condition need not be the same as the number of terms used for calculating image variations from the TCC derivatives A, B, .... A sufficiently accurate description of minor image variations due to small parameter variations around the nominal condition may be achieved with a large number of terms for $I_0$ and a significantly smaller number for the derivatives, in order to reduce the overall computation time.

For simplicity purposes, the following discussion will be based on defocus and exposure dose. However, it should be noted that all the disclosures herein can be extended to a generalized process window with other parameters such as NA, sigma, aberrations, polarization, or optical constants of the resist layer, as illustrated in (Eq.20).

In the embodiments set forth above, analytic expressions for the aerial image intensity in the vicinity of best focus for a range of process window parameters were developed. The following descriptions derive similar expressions and methods to calculate the resist image, which forms the basis for extraction of simulated resist contours across the process window.

Separable, Linear Resist Model

Although the response of photoresist to illumination by the projected aerial image may be strongly nonlinear, having a thresholding behavior, many processes occurring in the resist layer, such as diffusion during PEB, can be modeled by convoluting the aerial image intensity with one or more linear filters before applying the threshold. Such models will be generally referred to as 'linear' resist models, and the latent resist image for such models may be expressed schematically as:

$$R(x) = P\{I(x)\} + R_b(x) \quad (Eq.21)$$

here, P{ } denotes the functional action of applying a linear filter (i.e. generally a convolution), while $R_b$ is a mask loading bias that is independent of the aerial image. The resist threshold is understood to be included in $R_b$ such that resist contours correspond to locations where $R(x)=0$.

Applying this model to the general, scaled, interpolated aerial image intensity derived above, i.e., (Eq.12, assuming $f_0=0$ without loss of generality), results in $$R = [P\{I_0\} + R_b] + \varepsilon \cdot P\{I_0\} + (1+\varepsilon) \cdot f \cdot P\{a\} + \quad \text{(Eq. 22)}$$
$$(1+\varepsilon) \cdot f^2 \cdot P\{b\}$$
$$= R_0 + \varepsilon \cdot P\{I_0\} + (1+\varepsilon) \cdot f \cdot P\{a\} + (1+\varepsilon) \cdot f^2 \cdot P\{b\}$$
$$= R_0 + \Delta R(x, \varepsilon, f)$$

where $R_0$ is the resist image at a Nominal Condition (NC). All corrections due to changes in exposure dose and focus (or, other process window parameters) are derived by applying the same filter to the derivative images a, b as to the image $I_0$ at the nominal condition (NC), and simple scaling and summation of the correction terms.

Moreover, the effect of a linear filter may be included in the imaging TCC formalism, since the convolution with a filter in the space domain is equivalent to a multiplication with the filter's Fourier series components in the frequency domain. Starting from an aerial image expression (Eq.1):

$$I(x) = \Sigma_k \Sigma_{k''} TCC_{k',k''} M(k') M^*(k'') \exp(-j(k'-k'')x)$$

It is shown that the TCC matrix element at k', k" contributes to the (k'-k") frequency component of I(x) by the amount $TCC_{k',k''} M(k') M^*(k'')$. Therefore, a resist image defined by:

$$I(x) \otimes g(x)$$

where g(x) is a spatial filter with the Fourier transform being G(k), can be expressed as:

$$I(x) \otimes g(x) = \sum_{k'} \sum_{k''} TCC_{k',k''} M(k') M^*(k'')$$
$$\exp(-j(k'-k'')x) G(k'-k'')$$
$$= \sum_{k'} \sum_{k''} TCC^{new}_{k',k''} M(k') M^*(k'')$$
$$\exp(-j(k'-k'')x)$$

with a new TCC matrix defined as $$TCC^{new}_{k',k''} = TCC_{k',k''} G(k'-k'')$$

With this procedure, the linear filter is incorporated into the bi-linear TCC matrix, so all the computational procedures applicable to a purely optical aerial image may be applied to the linearly filtered aerial image. This property allows a significant reduction in overall computation time, since the complete resist image can be generated by a single evaluation of (Eq.1), with the only modification of adding weight factors corresponding to the Fourier coefficients of the filter P. For any given mask design input, this formulation would allow to generate directly, in one pass each, the images $P\{I_0\}$, $P\{a\}$, $P\{b\}$ from the pre-computed, filter-adjusted $TCC_0$, A, and B matrices. (Eq.22) then defines the actual resist image for any arbitrary process window point as a linear combination of these three images.

Non-Separable, Linear Resist Model

In the preceding discussions, it was implicitly assumed that all parameters of the linear filters establishing the resist model are constant across the variations of the process window parameters. This equates to one condition for an overall separable lithography model: resist model parameters are independent of optical model parameters. A pragmatic test for separability is the ability to accurately calibrate the model and to fit test data across the complete extent of the process window. In practice, the semi-empirical nature of models suitable for full-chip lithography simulation may preclude perfect separability and may require resist model parameters that are allowed to vary with process window parameters such as defocus, NA or sigma settings. For a physically motivated model, it should be expected (or required as a constraint), though that the model parameters vary smoothly under variation of the process window variables. In this case, the series expansion of the resist image may include derivative terms of the resist model parameters.

For illustration purposes, consider defocus as the only process window parameter. If the linear resist model is equivalent to a convolution with a linear filter, (or a multitude of linear filters), a separable model may be described by:

$$R(x,f) = P(x) \otimes I(x,f) + R_b(x) \quad \text{(Eq.23)}$$

while a non-separable model may require an explicit f-dependence of the filter $$R(x,f) = P(x,f) \otimes I(x,f) + R_b(x) \quad \text{(Eq.24)}$$

Now, considering through-focus changes, a pro-forma series expansion may be applied to (Eq.24), for illustration herein only up to first order:

$$R(x,f) = R(x, f_0) + [a_P(x) \otimes I_0(x) + P(x, f_0) \otimes a(x)] \cdot \quad \text{(Eq. 25)}$$
$$(f - f_0) + \ldots$$
$$= R_0(x) + \Delta R(x, f)$$

where $$a_P(x) = \frac{\partial P(x, f)}{\partial f}\bigg|_{f=f_0} \quad \text{(Eq. 26)}$$

If the resist model parameters are found to vary continuously across the process window space, similar series expansion and fitting as introduced above for the aerial image intensity (I) and transmission cross coefficients (TCC) can be applied to the resist model parameters during model calibration. In this case a linear, derivative filter $a_P$ can be calculated and be used in (Eq.25), which may also be extended in a straightforward way to include higher-order terms. In this situation, resist model parameters as well as aerial image variations are smoothly interpolated across the complete process window area. Both P and $a_P$ can be determined in a through-process window model calibration step based on experimental wafer data from test or gauge patterns.

However, even if resist model parameters appear to vary non-monotonously across the process window (PW), any piece-wise interpolation in between calibration points could provide 'best-guess' resist model parameters for arbitrary process window (PW) points.

General Resist Model

For a general resist model that may include nonlinear operations such as truncations of the aerial or resist image, the straightforward separation into nominal condition and derivative terms, as shown in (Eq.22) will be no longer valid. However, there are three alternative methods to deal with the non-linear operations.

i) Associated Linear Filter

First, it is assumed that the general variation of the resist image through the process window (PW) can be approximated formally by the second line in (Eq.22), with the reinterpretation that the linear filter P{ } will no longer correctly describe the resist model at the normal condition (NC). Instead, linear filter P{ } will be chosen to reproduce the best representation of differential resist image changes relative to the nominal condition (NC). While a nonlinear model may ensure the most accurate model fitting at the nominal condition (NC), it may require significantly more computation time than a linear model. By relying on such an associated linear filter to emulate the differential through-process window behavior, only a single evaluation of the nonlinear model will be required to generate $R_0(x)$, while process window analysis at a multitude of process window conditions can be based on more efficient evaluation of the linear filters $P\{I_0\}$, $P\{a\}$, $P\{b\}$.

The coefficients of the nominal condition resist model as well as of the associated filter may be determined from a unified model calibration procedure based on calibration test patterns and wafer gauge data covering pattern variations and process window variations, as an extension of the method described in U.S. patent application No. 60/719,837 and EP1941321.

Further, once a valid unified PW model (FEM) has been generated and calibrated in the manner set forth in U.S. patent application No. 60/719,837 or EP1941321, it will provide the best prediction of through-PW changes of the resist image. The parameters of the optimum associated filter may then be determined by minimizing the overall (RMS (root mean square)) difference between the simplified model using the associated filter and the complete, calibrated model, without any need for additional experimental calibration data.

Using the full model, for any suitable number and range of test structures, including e.g. 1-D (line/space) and 2-D (line ends etc) patterns, 'correct' resist images and contours can be simulated for any number of PW points. In addition, the values of the derivative images a and b can be calculated in the vicinity of the resist contours. For each pattern, the change of R(x) through-PW will be calculated at pattern-specific gauge points, e.g. the tip of a line for a line-end test pattern, or along any point of the NC resist contour. At each of these evaluation points $x_i$ through $$\Delta R(x_i,\epsilon,f)=R(x_i,\epsilon,f)-R(x_i,\epsilon=0,f=f_0)=R(x_i,\epsilon,f) \quad (Eq.27)$$

since $x_i$ is assumed to be on a resist contour, where $R(x_i,\epsilon=0,f=f_0)=0$.

$\Delta R(x_i,\epsilon, f)$ should be well approximated by $$\Delta R_a(x_i)=\epsilon \cdot P\{I_0(x_i)\}+(1+\epsilon)\cdot f \cdot P\{a(x_i)\}+(1+\epsilon)\cdot f^2 P\{b(x_i)\} \quad (Eq.28)$$

Therefore, the optimal associated filter will minimize the sum of squared differences between (Eq.27) and (Eq.28), and can be determined by a variety of known optimization algorithms. It is noted that evaluation of (Eq.27) and (Eq.28) during the associated filter fitting should be performed at resist contours, so that the resulting filter most closely reproduces changes close to edge positions. Performance of the associated filter—in terms of accurately predicting changes in the resist image level—far away from edge positions is generally not required. After this fitting routine, the full-PW behavior of the resist images is again described as $$R(x,\epsilon,f)=R_0(x)+\Delta R_a(x,\epsilon,f) \quad (Eq.29)$$

where the filtered differential images can be efficiently calculated within the TCC formalism, the $\Delta R$ constitutes relatively small perturbations, and the resist images at any arbitrary PW point can be predicted from a simple linear combination of the four images $R_0$, $P\{I_0\}$, $P\{a\}$, and $P\{b\}$.

ii) Embedded Linearization

The above approach presents a linearized filter (i.e., the associated filter) which is optimal in that it is the single linear filter which minimizes the (RMS) difference for all pattern-specific gauge points or along any point of the NC (Nominal Condition) resist contour. Next, an alternative approach is discussed which incorporates resist model linearization in the computation of derivative resist images.

More specifically, after obtaining a and b in (Eq.2), the goal becomes identifying $R_0$, Ra and Rb such that their linear combination (assuming that $f_0=0$ without loss of generality)

$$R_{EL}(x,f)=R_0(x)+Ra(x)\cdot f+Rb(x)\cdot f^2 \quad (Eq.30)$$

is the best fit for $$R(x, f_l) = R\{I(x, f_l)\} \quad (Eq. 31)$$
$$= R\{I_0(x) + a(x)\cdot f_l + b(x)\cdot f_l^2\}$$

over a number of focus positions $f_l=\{f_1, f_2, \ldots, f_L\}$ with possibly a set of weights $\{W_1, W_2, \ldots, W_L\}$, where $R_0$ is the resist image at NC. (Eq.31) is essentially applying the resist model $R\{\cdot\}$ to the aerial image expressed in (Eq.2). It is noted that the resist model $R\{\cdot\}$ may be non-linear, thus Ra and Rb are not necessarily $P\{a\}$ and $P\{b\}$ or $R\{a\}$ and $R\{b\}$.

As such, $$R_0(x) = R(I_0(x)) \quad (Eq. 32)$$

$$Ra(x) = \sum_{l=1}^{L} h_{al}[R(x, f_l) - R_0(x)]$$

$$Rb(x) = \sum_{l=1}^{L} h_{bl}[R(x, f_l) - R_0(x)]$$

where $h_{al}$ and $h_{bl}$ are coefficients defined in (Eq.9). The coefficients only depend on $\{f_1, f_2, \ldots, f_L\}$ and possibly weights $\{W_1, W_2, \ldots, W_L\}$, and they are independent of $R(x, f_l)$ or $I(x, f_l)$.

In general, the resist model $R\{\cdot\}$ can be separated as:

$$R\{I(x)\}=P\{I(x)\}+P_{NL}\{I(x)\}+R_b \quad (Eq.33)$$

where $R_b$ is a mask loading bias that is independent of the aerial image I(x) or focus, P{ } is the linear filter operation and $P_{NL}\{\ \}$ is some non-linear operation.

Combining (Eq.32) and (Eq.33), $$Ra(x) = \sum_{l=1}^{L} h_{al}[R(x, f_l) - R_0(x)] \quad (Eq. 34)$$
$$= \sum_{l=1}^{L} h_{al}[P\{I(x, f_l)\} - P\{I_0(x)\}] +$$
$$\sum_{l=1}^{L} h_{al}[P_{NL}\{I(x, f_l)\} - P_{NL}\{I_0(x)\}]$$

-continued $$Rb(x) = \sum_{l=1}^{L} h_{bl}[R(x, f_l) - R_0(x)]$$

$$= \sum_{l=1}^{L} h_{bl}[P\{I(x, f_l)\} - P\{I_0(x)\}] +$$

$$\sum_{l=1}^{L} h_{bl}[P_{NL}\{I(x, f_l)\} - P_{NL}\{I_0(x)\}]$$

As discussed previously, since P{ } is a linear operation, then $$P\{I(x, f_l)\} = P\{I_0(x) + a(x) \cdot f_l + b(x) \cdot f_l^2\} \quad \text{(Eq. 35)}$$

$$= P\{I_0(x)\} + P\{a(x)\} \cdot f_l + P\{b(x)\} \cdot f_l^2$$

As expected, it is possible to derive the following result with the aid of (Eq.9) and (Eq.10) set forth above, $$\sum_{l=1}^{L} h_{al}[P\{I(x, f_l)\} - P\{I_0(x)\}] = \quad \text{(Eq. 36)}$$

$$\sum_{l=1}^{L} h_{al}[P\{a(x)\} \cdot f_l + P\{b(x)\} \cdot f_l^2] =$$

$$P\{a(x)\} \cdot \sum_{l=1}^{L} [h_{al} \cdot f_l] + P\{b(x)\} \cdot \sum_{l=1}^{L} [h_{al} \cdot f_l^2] =$$

$$P\{a(x)\} \sum_{l=1}^{L} h_{bl}[P\{I(x, f_l)\} - P\{I_0(x)\}] =$$

$$\sum_{l=1}^{L} h_{bl}[P\{a(x)\} \cdot f_l + P\{b(x)\} \cdot f_l^2] =$$

$$P\{a(x)\} \cdot \sum_{l=1}^{L} [h_{bl} \cdot f_l] + P\{b(x)\} \cdot \sum_{l=1}^{L} [h_{bl} \cdot f_l^2] = P\{b(x)\}$$

Thus, Ra and Rb can computed from $$Ra(x) = P\{a(x)\} + \sum_{l=1}^{L} h_{al}[P_{NL}\{I(x, f_l)\} - P_{NL}\{I_0(x)\}] \quad \text{(Eq. 37)}$$

$$Rb(x) = P\{b(x)\} + \sum_{l=1}^{L} h_{bl}[P_{NL}\{I(x, f_l)\} - P_{NL}\{I_0(x)\}]$$

The benefits of this approach are that it does not attempt to capture the differential through-PW behavior for all gauge points using a single linear filter. Rather, this approach minimizes the (RMS) difference for each pixel, thereby improving the overall accuracy. In addition, this approach does not require identification of pattern-specific gauge points or all NC resist contour neighboring points. One drawback is that this approach slightly increases the computation complexity for Ra and Rb. However, since the synthesis of through-PW resist images only require scaling and additions of $R_0$, Ra and Rb, the increase in the computation complexity of the derivative images is generally insignificant compared to the reduction in computation complexity of through-PW resist images, especially for dense PW sampling.

iii) Polynomial Approximation of Non-Linear Operations

In a third approach, non-linear resist model operations are approximated using polynomials. More specifically, for truncation operations on image I(x), for the purpose of emulating acid and base reaction effects, quadratic polynomials of the image provide a sufficient approximation. Another typical non-linear operation, the linear filtering of the image slope, can be expressed precisely as the linear filtering of a quadratic function of the image gradient $G\{I(x)\}=I(x)-I(x-1)$, thus the quadratic polynomial of the aerial image I(x) itself. More specifically, letting $G\{\bullet\}$ be the gradient operation and the linear filter be $P_{Slope}\{\bullet\}$, then this non-linear operation can be expressed as:

$$P_{Slope}\{G\{I(x)\}\}=P_{Slope}\{(I(x)-I(x-1))^2\} \quad \text{(Eq.38)}$$

To summarize, the resist image from aerial image I(x) can be approximated as:

$$R\{I(x, f)\} = P_1\{I(x, f)\} + P_2\{I^2(x, f)\} + R_b(x) + \quad \text{(Eq. 39)}$$

$$P_{Slope}\{(I(x, f) - I(x-1, f))^2\}$$

$$= P_1\{I_0(x) + a(x) \cdot f + b(x) \cdot f^2\} +$$

$$P_2\{(I_0(x) + a(x) \cdot f + b(x) \cdot f^2)^2\} + R_b(x) +$$

$$P_{Slope}\{(I_0(x) + a(x) \cdot f + b(x) \cdot f^2 -$$

$$I_0(x-1) - a(x-1) \cdot f - b(x-1) \cdot f^2)^2\}$$

$$= P_1\{I_0(x)\} + P_1\{a(x)\} \cdot f + P_1\{b(x)\} \cdot f^2 +$$

$$P_2\{I_0^2(x)\} + 2P_2\{a(x) \cdot I_0(x)\} \cdot f +$$

$$P_2\{2b(x) \cdot I_0(x) + a^2(x)\} \cdot f^2 +$$

$$2P_2\{a(x) \cdot b(x)\} \cdot$$

$$f^3 + P_2\{b^2(x)\} \cdot f^4 + R_b(x) +$$

$$P_{Slope}\{(G\{I_0\}(x) + G\{a\}(x) \cdot f + G\{b\}(x) \cdot f^2)^2\}$$

$$= \{P_1\{I_0(x)\} + P_2\{I_0^2(x)\} + P_{Slope}\{G^2\{I_0\}(x)\} +$$

$$R_b(x)\} + \{P_1\{a(x)\} + 2P_2\{a(x) \cdot I_0(x)\} +$$

$$2P_{Slope}\{G\{a\}(x) \cdot G\{I_0\}(x)\}\} \cdot f + \{P_1\{b(x)\} +$$

$$P_2\{2b(x) \cdot I_0(x) + a^2(x)\} + P_{Slope}\{2G\{a\}(x) \cdot$$

$$G\{I_0\}(x) + G^2\{a\}(x)\}\} \cdot f^2 + 2\{P_2\{a(x) \cdot b(x)\} +$$

$$P_{Slope}\{G\{a\}(x) \cdot G\{b\}(x)\}\} \cdot f^3 + \{P_2\{b^2(x)\} +$$

$$P_{Slope}\{G^2\{b(x)\}\} \cdot f^4$$

$$= R_0(x) + R_1(x) \cdot f + R_2(x) \cdot f^2 + R_3(x) \cdot f^3 +$$

$$R_4(x) \cdot f^4$$

Once again, $P_1\{\bullet\}$ represents the linear filter for the aerial image term, $P_2\{\bullet\}$ represents the linear filter for the aerial image square term, and $P_{Slope}\{\bullet\}$ represents the linear filter for the aerial image gradient term, while $R_b$ is a mask loading bias that is independent of the image pattern. Thus the resist image is expressed as a $4^{th}$-order polynomial of the defocus value. However, in a typical application, $R_3(x)$ and $R_4(x)$ are very small and cay be ignored to improve the computational efficiency.

As noted above, the goal of lithography design verification is to ensure that printed resist edges and line widths are within a pre-specified distance from the design target. Similarly, the size of the process window—exposure latitude and depth of focus—are defined by CDs or edge placements falling within the specified margin. The various methods outlined above provide very efficient ways to determine the change of resist image signal level with variation of focus and exposure dose or other, generalized PW parameters. Each method resulted in an approximate expression of through-PW resist image variations $\Delta R$ as perturbation of the NC (Nominal Condition) image $R_0$.

In order to relate these changes in R(x) to changes in edge placement, in most cases a first-order approximation will suffice, due to the small CD or edge placement tolerances. Therefore, the lateral shift of any resist contour (R=0) (i.e., the edge placement change) is simply approximated by the image gradient G at the original (i.e. NC) contour location and the change in resist image level $\Delta R$ due to variation of focus, dose, etc. as:

$$\Delta EP(x_i, \varepsilon, f) = \frac{\Delta R(x_i, \varepsilon, f)}{G(x_i, \varepsilon = 0, f = f_0)} \quad \text{(Eq. 40)}$$

where both the initial contour location and the gradient are determined from the resist image at NC, i.e. $R_0(x,y)$. The 2-dimensional edge shift can be calculated separately in the x and y direction by the partial image derivative in each direction, or as an absolute shift using an absolute gradient value, i.e. the geometrical sum of $S_x = R_0(x,y) - R_0(x-1,y)$ and $S_y = R_0(x,y) - R_0(x,y-1)$, i.e., the absolute gradient value $S = \sqrt{S_x^2 + S_y^2}$.

From the foregoing explanation, the edge shift can be directly expressed as a function of the differential images defined above:

$$\Delta EP(x_i, \varepsilon, f) = \quad \text{(Eq. 41)}$$
$$\frac{1}{S(x_i)} [\varepsilon \cdot P\{I_0(x_i)\} + (1+\varepsilon) \cdot f \cdot P\{a(x_i)\} + (1+\varepsilon) \cdot f^2 \cdot P\{b(x_i)\}]$$

while changes in CD or line widths can be determined from adding the individual edge placement shifts on either side of a line, resulting generally in $\Delta CD = 2 \cdot \Delta EP$. Clearly, (Eq.41) will be able to reproduce the typical $2^{nd}$ order-like through-focus behavior of CD or EPE curves. More importantly, after the set of images such as $[R_0, P\{I_0\}, P\{a\}, P\{b\}]$ has been calculated, which may be accomplished with only ~1× more computation than simulating the single image at NC (assuming that fewer TCC terms are required for sufficient accuracy on the differentials), (Eq.41) may be applied to map out analytically the complete PW for every single edge position on a design, without the need for any further time-consuming image simulation. A generic flow diagram to illustrate this method is provided in FIG. 5.

Figure 5:
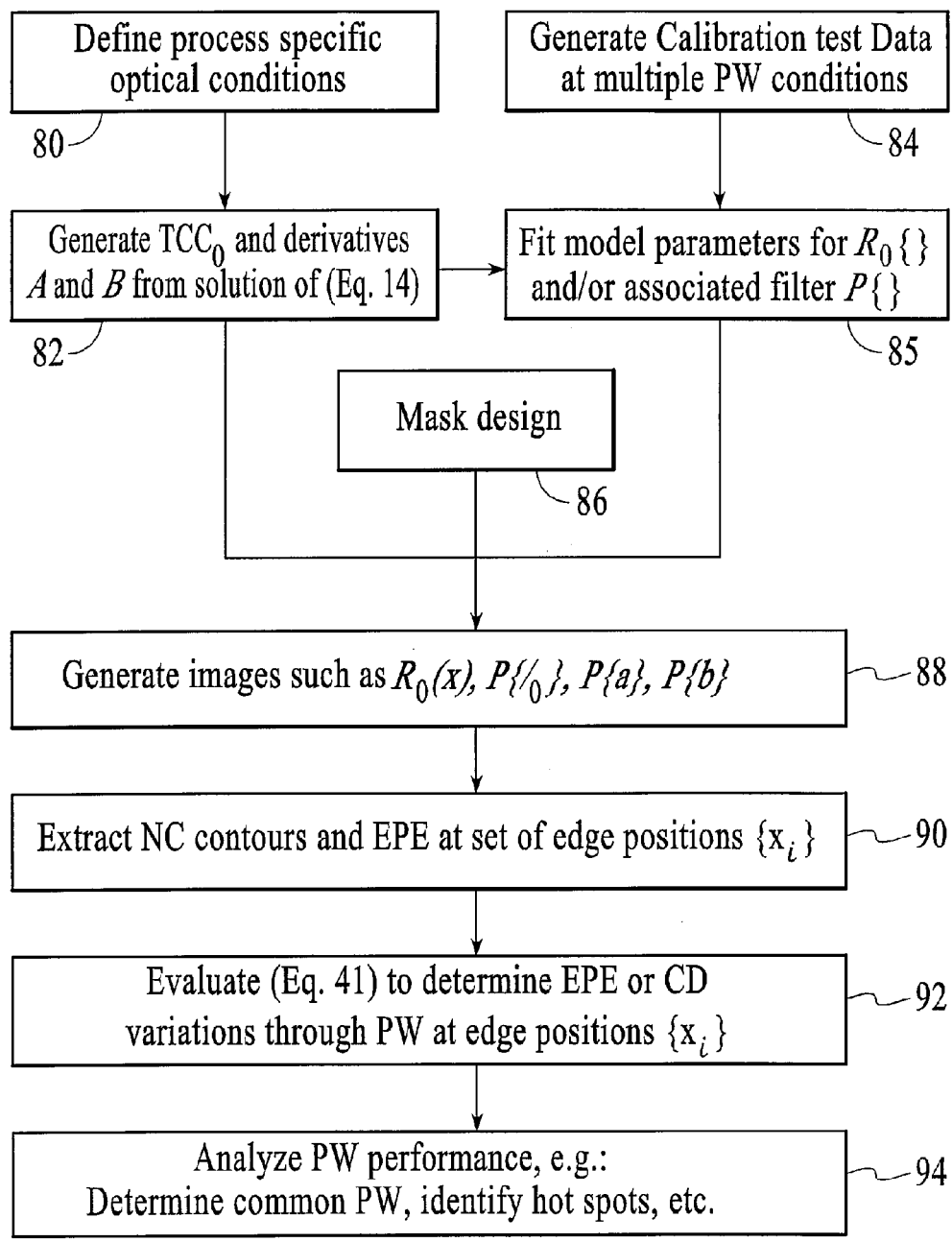

Referring to FIG. 5, the first step (Step 80) entails defining the process specific parameters associated with the lithography process and system that will be utilized in the imaging process. Thereafter, derivative TCCs A and B are generated utilizing (Eq.14) (Step 82). In Step 84, calibration test data is acquired for multiple process window conditions. In Step 85, model parameters for $R_O\{\ \}$ and/or associated filter $P\{\ \}$ are determined utilizing in part the results of Step 82. Next, the target mask pattern or design is defined (Step 86). The process then proceeds to generate images such as $R_O(x), P\{I_O\}, P\{a\}$ and $P\{b\}$ in Step 88. Next, the simulated image is synthesized, NC contours are extracted, and feature EPEs are determined at a given set of edge positions $\{x_i\}$ (Step 90). The process then proceeds to Step 92 to determine EPE or CD variations through process window at edge positions $\{x_i\}$.

Finally, in Step 94, the results obtained in Step 92 are analyzed to determine whether the resulting image is within a predefined error tolerance, thus, determining a common process window as well as identifying any problem area (i.e., hot-spots) within the design.

Illumination Optimization

The foregoing discussion was essentially directed to the method of simulating imaging performance utilizing a simulation function which accounts for process variations associated with the lithographic process. The discussion now turns to methods of optimizing the illumination source.

Range Based Optimization

In general, the first step in the illumination optimization process is to identify the layout of the target pattern for a patterning device (such as and also referred to as the mask pattern) for which the illumination will be optimized. The next step in the process is to identify a set op optimization points within the target pattern for the patterning device for which the illumination source will be optimized. For efficiency considerations, a limited number of optimization points representing the target pattern are chosen. In an embodiment the optimization points are critical points within the target pattern for the patterning device (such as a mask pattern), which typically correspond to the features of the target pattern for the patterning device that are expected to be the most difficult to image properly (i.e., imaging within the allowed error tolerances). For example, critical points correspond to, but are not limited to, critical integrated circuit modules or cells, such as the most densely spaced cells, or alternatively, cells contained on the integrated circuits critical paths. In an alternative embodiment the optimization points are randomly distributed over the target pattern. The method according to an embodiment of the invention does not pose a restriction to the number of optimization points. For the purposes of the current embodiment, it is assumed that there are M critical points in the circuit pattern. It will be clear to the skilled person that the critical points may be identified based upon a target substrate pattern, i.e. the pattern that is the intended result of the complete lithographic process. In such a case the corresponding critical points on the target pattern for the patterning device are determined for instance by methods well known to the person skilled in the art.

As explained further below, the illumination optimization process of the given embodiment also utilizes Design For Manufacture (DFM) metrics such as MEEF (Mask Error Enhancement Factor), derivative of critical dimension versus process window parameters, or the local aerial image intensity slope, etc. For the purposes of the given example, it is assumed that there are N DFM metrics under consideration.

Considering the illumination pupil, it is noted that due to the band-limited nature of the projection system, the illuminator can be divided into a set of incoherent point radiation sources using a suitable grid without losing information. Each point of the illumination pupil represents a radiation source that is independent of all other points on the pupil, and each pupil point by itself is at the basis of a coherent imaging process. As such, the final total image intensity can be determined by the summation of the intensity contribution from all of the individual pupil points (i.e., the aerial image intensity can be computed by summing up the aerial image intensities corresponding to each of the point sources). Further, since this is a linear summation, the final total value of the design for manufacture metric (which can be calculated based on aerial image intensity without considering the resist exposure part) can be approximated as an (arithmetic) average of the values of the DFM metrics from the individual illumination pupil point sources. For example, there are P illumination pupil points that emit radiation onto the mask and these illumination pupil points' corresponding TCCs are denoted by $TCC_1, \ldots, TCC_P$, then if only the p-th illumination pupil point with $TCC_p$ (p=1, ..., P) emits radiation onto the mask, the resulting aerial image intensity $I_p$ can be computed using (Eq.1) or (Eq.3). Note that as the imaging system is coherent for each individual illumination pupil point, the number of eigenvalues (N) in (Eq.3) is always 1, which makes the computation extremely simple. Then, when all these P illumination pupil points are emitting radiation, the final total aerial image intensity I can be computed as:

$$I = \sum_{p=1}^{P} I_p \qquad (Eq. 42)$$

The n-th DFM metric of the aerial image intensity I can be represented as $D_n(I)$ (n=1, ..., N), then by (Eq.42) and using the approximation of the linearity of the DFM metric, $D_n(I)$ can be determined by:

$$D_n(I) = D_n\left(\sum_{p=1}^{P} I_p\right) = \frac{1}{P}\sum_{p=1}^{P} D_n(I_p) \qquad (Eq. 43)$$

As such, for each individually addressable point in the illumination pupil and for each of the M critical circuit points, it is possible to calculate the values of the N DFM metrics. This results in a map of N×M values of the DFM metrics for each individually addressable point in the illumination pupil. Denoting the coordinates on the illumination pupil plane as $(x_p, y_p)$ (the illumination pupil point index p is replaced by its illumination pupil plane coordinate $(x_p, y_p)$), the map can be defined as $D_{mn}(x_p, y_p)$, wherein for each (m,n), there is a map of the value of the DFM metric in the illumination pupil plane $(x_p, y_p)$. In an embodiment the computation is improved by not computing the values of the N DFM metrics for every illumination pupil point, and by alternatively performing an interpolation process to determine all of the values of the N DFM metrics utilizing the computed values. It is noted however, that the determination of the N×M values for the DFM metrics is typically not a bottleneck. In a further embodiment wherein aberration data is not available, the aberration value at the nominal condition is utilized, and the aberration-sensitivity is made part of the DFM metrics.

Then, based on the requirements of the fabrication process, it is possible to specify the minimum (or maximum, depending on which metric is being utilized) acceptable value of the final total image DFM metric $D_{mn}$ (for each critical point (m) and each DFM metric (n)) or simply $D_n$ (which only specifies the tolerance for each individual DFM metric but has no distinction between circuit points). Having determined a maximum or minimum acceptable value, a range of acceptable values of the DFM metric is intrinsically identified (i.e. the values below (and including) the maximum acceptable value or above (and including) the minimum acceptable value). The final total image DFM metric $D_{mn}$ is the average of $D_{mn}(x_p, y_p)$ in all open illumination pupil points (i.e., illumination points emitting radiation onto the mask). It is then straightforward to find the open area in the illumination pupil plane dictated by the requirement of each individual $D_{mn}$.

Figure 6:
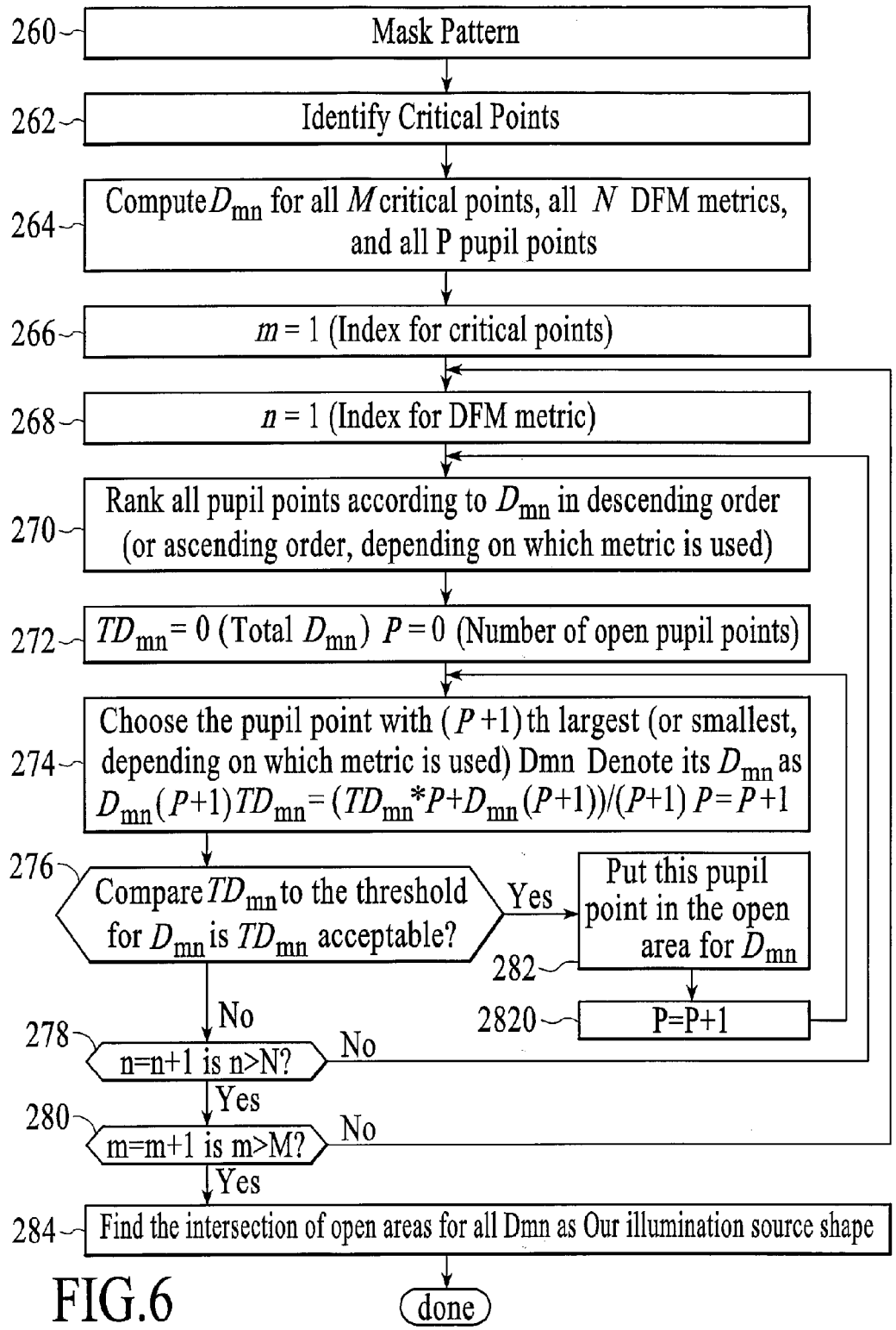
FIG. 6 is a flowchart illustrating a first exemplary embodiment of the process for optimizing the illumination source.

More specifically, as illustrated in FIG. 6, the first step in the illumination optimization process (Step 260) of the given embodiment is to identify the target pattern (also referred to as the mask pattern) for which the illumination will be optimized. The next step in the process (Step 262) is to identify optimization points within the target pattern (or mask pattern). In this embodiment critical points are chosen. As noted above, critical points may include, but are not limited to, critical circuit modules or cells, such as the most densely spaced cells, or alternatively, cells contained on the target IC's critical paths. In Step 264, the values of the DFM metrics associated with all individual source points (i.e., pupil points) are determined for each of the M critical circuit points for each of the N DFM metrics being considered. Next, in Steps 266 and 268, the process iterates over all possible critical points and all DFM metrics. Specifically, for each critical point (m) and each DFM metric ($D_n$), the source points are ranked according to their values for the DFM metric ($D_{mn}$) in a descending order (or ascending order, depending on the DFM metric being utilized) in Step 270. In Step 272, both the final total image DFM metric ($D_{mn}$) and the number of open pupil points (P) are initialized to 0. In Step 274, the (P+1)-th pupil point is chosen, and $D_{mn}$ and P are updated. It is then determined (Step 276) whether or not the average DFM metric value of all source points (p) currently selected is below (or above, depending on which DFM metric is utilized) the threshold for acceptable DFM metric values which was predefined based on the given fabrication process. If the average DFM metric value of the selected source points (p) is not acceptable, then the open area identification process for $D_{mn}$ is complete and we will proceed to the next DFM metric (Step 278) or the next critical point (Step 280) and Steps 270-274 are repeated. If the average DFM metric value of the currently selected source points is acceptable, the pupil point is included in the illumination pattern (Step 282) by increasing P with 1, and the process proceeds back to Step 274, in which the next source point is selected (i.e., opened), and the foregoing analysis is repeated. Thus a first set of illumination points is determined per critical point and per design for manufacturing metric. After all M critical points and all N DFM metrics are considered, a second set of illumination points is determined as the intersection of all first sets (open areas, selected or open source points). The second set defines the final illumination pupil shape (Step 284). It is noted that as a result of the foregoing process, the commonly covered area, i.e., the intersection of all open areas, will satisfy the fabrication process requirements.

Cost Function Based Optimization

In an embodiment the fabrication process does not specify individual values for DFM metric $D_{mn}$, but instead defines a cost function as a function of the DFM metric $D_{mn}$ and an iteration criterion such as the total number of open (selected) pupil points. In this embodiment a non-linear optimization algorithm is applied to find the open pupil points that optimize the cost function. Typically, there is a requirement for a minimum value of the acceptable aerial image intensity (I), which is proportional to the total number of open pupil points. This can be understood by realizing that the more open points, the more radiation passes through the illumination pupil. The cost function can be defined as $F(D_{mn}|m=1, \ldots, M; n=1, \ldots, N)$. For example, the cost function may be a weighted average of the set $\{D_{mn}\}$ of DFM metrics $D_{mn}$, i.e., $$F(D_{mn}|m=1, \ldots, M; n=1, \ldots, N) = \sum_{m,n} \beta_{mn} D_{mn},$$

where $\beta_{mn}$ are some constant weights, i.e., Lagrange multipliers. These Lagrange multipliers dictate the importance of every combination of critical point and DFM metric in the optimization process.

Generally speaking, the cost function operates to map an aerial image intensity (I) to a real number and design. The illumination optimization algorithm then operates to select a given number of source points such that the cost function is optimized for the resulting aerial image intensity (I). The optimized cost function thus corresponds to the optimal illumination. Further, in order to reduce the computation complexity and emphasize a set of optimization points (such as critical points) on the target, the cost function is only computed over those optimization points. The choice of the cost function is important because it determines both the quality of the final aerial image intensity (I) and the complexity and the accuracy of the algorithm. In an embodiment the standard max-min cost criterion is used combined with the greedy algorithm (wherein choices made in earlier iteration steps are not re-evaluated in later iteration steps) which always selects the local optimum at each stage. Simulations indicate that this yields acceptable results and is fast.

The cost function of the max-min criterion is defined as the minimum local gradient of the optimization points, here critical points. In addition to the coordinates of the critical points, the directions on which the gradient should be optimized are also provided. More specifically, for a point (x,y) in the (aerial) image plane 22 (note that this is different from the pupil plane point $(x_p, y_p)$), the gradient (G) of the aerial image intensity (I), which gradient is a vector, can be computed as:

$$\vec{G}(x, y) = \left(\frac{\partial I}{\partial x}, \frac{\partial I}{\partial y}\right)$$

where I(.) represents the aerial image intensity.
Then $$|\vec{G}(x, y)| = \sqrt{\left(\frac{\partial I}{\partial x}\right)^2 + \left(\frac{\partial I}{\partial y}\right)^2}$$

represents the magnitude of the gradient, and the unit vector $\vec{G}(x, y)/|\vec{G}(x,y)|$ represents the gradient direction. The optimization algorithm tries to maximize the cost function in a "greedy" manner, that is, the algorithm selects the next aerial image intensity (I) that yields next best cost function value.

Figure 7:
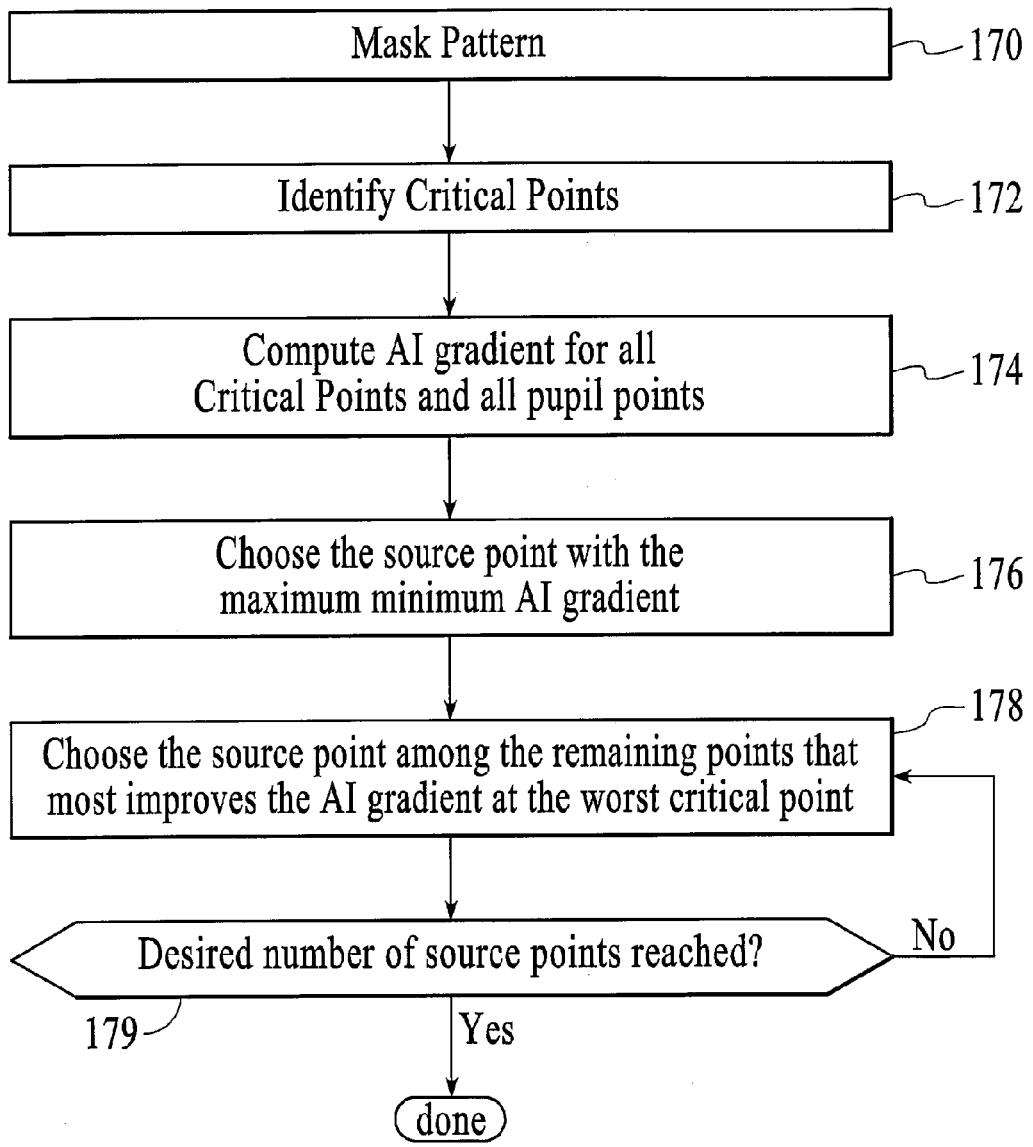
FIG. 7 is an exemplary flowchart illustrating a second exemplary embodiment of the process for optimizing the illumination source.

FIG. 7 illustrates a flowchart of the illumination optimization process according to an embodiment which utilizes the aforementioned "greedy" optimization of a max-min function. The first step in the illumination optimization process (Step 170) is to identify the target pattern (also referred to as the mask pattern) for which the illumination will be optimized. The next step in the process (Step 172) is to identify optimization points, here critical points, within the target pattern or mask pattern. As noted above, critical points may include, but are not limited to, critical circuit modules or cells, such as the most densely spaced cells, or alternatively cells contained on the target IC's critical paths. In Step 174, the values for the DFM metric, which in the given embodiment correspond to the magnitude of the aerial image intensity gradient (G), associated with the P individual pupil points (or source points) are determined for the M critical circuit points. Next, in Step 176, the pupil point having the highest value of the DFM metric among all critical points is selected. This corresponds to selecting the source point which maximizes the minimum aerial image intensity gradient (G) among all critical points (analogue to finding a local optimum). In this way, for all critical points the minimum gradient is optimized by selecting source points. Larger gradients give larger contrast (in this case for all critical points with that selected source point). In an embodiment, the source point having the lowest value of the DFM metric among all critical points is selected. This step can be formulated as:

$$\underset{\text{all pupil points } (x_p, y_p)}{\arg\max} \ \underset{\text{all critical points } (x_c, y_c)}{\min} |G_{(x_p, y_p)}(x_c, y_c)|$$

where $G_{(x_p, y_p)}(x_c, y_c)$ represents the aerial image intensity gradient at critical point $(x_c, y_c)$ and the aerial image intensity gradient G is associated with pupil point $(x_p, y_p)$. The function arg min represents the argument of the minimum, i.e., the value of the given argument for which the value of the given object function achieves its minimum. (The corresponding opposite is the arg max function which represents the argument of the maximum.)

Thereafter, in Step 178, the source point among the remaining source points that most improves the aerial image intensity gradient G at the worst critical point (with respect to the imaging result) is selected (i.e., opened). The process then proceeds to evaluating the iteration criterion. In the embodiment in step 179 it is determined if the desired number of source points have been selected (as noted above, this number is set from the requirement on aerial image intensity by the fabrication process). If the number of selected (i.e., open) source points equals the desired number of source points set by the fabrication process, the process is complete and the selected source points define the optimized illumination. If the number of currently selected source points is less than the desired number, the process returns to Step 178 to select the next best source point and then returns to Step 179. This reiterative process continues until the desired number of source points has been selected.

In an embodiment, the termination of the iteration does not depend on whether the desired number of source points is reached, but another iteration criterion is used. For example, the iteration proceeds until a number of iterations has been reached, or until the maximum minimal gradient is below a certain value or until the maximum minimal gradients for a critical point $(x_c, y_c)$ in the image plane (22) differ too much depending in the direction of the gradient. Alternatively a combination of criteria is used.

It is noted that by modeling the various cost functions to have a linear dependency of the source point positions, it is possible to avoid having to determine the aerial image intensity (I) for each source plane configuration by direct simulation. Therefore, in an embodiment the aerial image intensity is only determined by simulation for a subset of illumination pupil points and the values for the aerial image intensity in the illumination pupil points which are not in the subset are determined via interpolation.

In another embodiment, the illumination optimization is combined with the polynomial representation of the aerial image intensity terms. In this situation, the objective is to optimize the source to reduce the aerial image intensity variation with respect to process window parameters such as defocus (i.e. to optimize the source so that the aerial image intensity is as constant as possible within the process window). Here the aerial image intensity (I) is expressed as a polynomial of the process window parameters' values. As such, it is possible to use polynomial coefficients as part of the optimization selection criteria (i.e., DFM metric) when selecting source points. In an embodiment, the aerial image intensity (I) is modeled as a polynomial with terms relating to defocus and corresponding defocus coefficients expressing the weight of the polynomial terms (or the sensitivity of the aerial image intensity with respect to defocus). Those source points with the smallest defocus coefficients should be selected. In a greedy embodiment the source points which correspond to a minimum of the maximum absolute value or the maximum square of the defocus coefficients are selected. For each source point, we can compute the images intensity derivatives a and b from (Eq.9) or (Eq.17). For an arbitrary image with M elements, i.e., $T=[T_j]_M$, we denote its magnitude as $|T|$. The magnitude can be the maximum absolute value of its elements, i.e., $$|T| = |T|_\infty = \max_{1 \le i \le M} |T_i| \quad \text{(a)}$$

or the square of the elements, i.e., (Eq. 44)

$$|T| = |T|_2 = \frac{1}{M}\sum_{i=1}^{M} T_i^2 \quad \text{(b)}$$

We can rank the source point according to $\lambda|a|+|b|$, where $\lambda$ is a user-specified non-negative constant which determines the trade-off between the magnitudes of a and b. Similar to choosing the source points with respect to DFM metric or the gradient (G) of the aerial image intensity (I), we can always choose the source point with smallest image intensity derivative magnitude until the desired number of source points is reached. Further, since the nominal condition is typically the "best" nominal condition, i.e., it is composed of best focus and best dose, then a=0 and we can simply rank the source points with respect to the magnitude of the $|b|$. In the remaining discussion, we assume that a=0 to simplify the notation. However, it should be noted that all these methods can be easily extended to the cases where a≠0.

Figure 8:
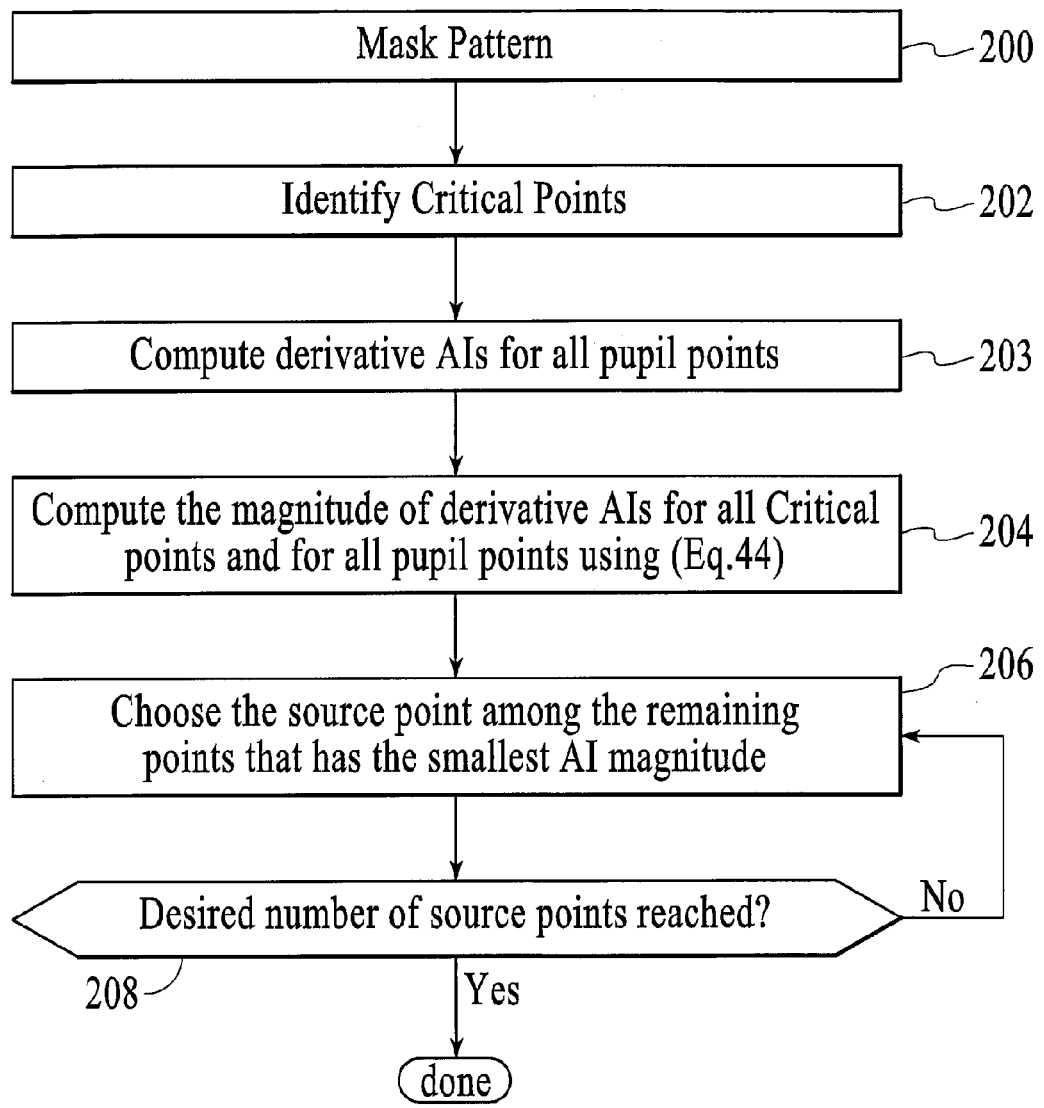
FIG. 8 is an exemplary flowchart illustrating another variation of the illumination optimization process.

It will be clear to the skilled person that although there is not theoretical limit to the number of optimization points, in an efficient embodiment there is only focus on a limited number of critical points. FIG. 8 illustrates a flowchart of the illumination optimization process which utilizes the aforementioned optimization using image intensity derivatives around critical points. The first step in the illumination optimization process (Step 200) is to identify the target pattern (also referred to as the mask pattern) for which the illumination will be optimized. The next step in the process (Step 202) is to identify critical points within the target circuit pattern or mask pattern. As noted above, critical points may include, but are not limited to, critical circuit modules or cells, such as the most densely spaced cells, or alternatively cells contained on the target IC's critical paths. In Step 204, the magnitude of image intensity derivative values, associated with the individual source points (i.e., pupil points) are determined for the critical circuit points. Next, in Step 206, the source point having the lowest magnitude of image intensity derivative values is selected. This step can be formulated as:

$$\arg\max_{\text{all pupil points }(x_p,y_p)} \frac{1}{L}\sum_{\text{all critical points }(x_c,y_c)} |b_{(x_p,y_p)}(x_c, y_c)|^2 \quad \text{(a)}$$

or (Eq. 45)

$$\arg\min_{\text{all pupil points }(x_p,y_p)} \max_{\text{all critical points }(x_c,y_c)} |b_{(x_p,y_p)}(x_c, y_c)| \quad \text{(b)}$$

Where L is the number of critical points, $b_{(x_p,y_p)}(x_c, y_c)$ stands for the image intensity derivative at critical point $(x_c, y_c)$ and this image intensity derivative is associated with source point $(x_p, y_p)$. Further, for every source point $(x_p, y_p)$, $|b_{(x_p,y_p)}(x_c,y_c)|$ itself can be viewed as an image with pixels being all the critical points $(x_c, y_c)$, and $$\frac{1}{L}\sum_{\text{all critical points }(x_c,y_c)} |b_{(x_p,y_p)}(x_c, y_c)|^2$$

and $$\max_{\text{all critical points }(x_c,y_c)} |b_{(x_p,y_p)}(x_c, y_c)|$$

can be viewed as the magnitude of image $|b_{(x_p,y_p)}(x_c, y_c)|$ over all critical points, which we denote as $\|b_{(x_p,y_p)}(x_c, y_c)\|$. As a result, the source point with minimum $\|b_{(x_p,y_p)}(x_c, y_c)\|$ will result in the best overall contour fidelity around critical points. Note that if we choose (Eq.45b), we are using a min-max algorithm which minimizes the sensitivity of the aerial image intensity for the worst critical point.

Thereafter, the illumination source point among the remaining illumination source points that has the smallest magnitude of aerial image intensity derivative values is selected (i.e., opened). Without reconsidering if the earlier chosen source points together form an optimal set of source points, the process then proceeds to Step 208 in which it is determined if the desired number of source points have been selected (as noted above, this number is set from the requirement on aerial image (AI) intensity (I) by the fabrication process). If the number of selected (i.e., open) illumination source points equals the desired number of source points set by the fabrication process, the process is complete and the selected source points define the optimized illumination. If the number of currently selected source points is less than the desired number, the process returns to Step 206 to select the next best source point and then returns to Step 208. This iterative process continues until the desired number of source points have been selected. It will be clear to the skilled person that other iteration criteria can be used as well in an analogue variety as explained earlier.

In an embodiment, a pair source points with coefficients of opposite sign can be selected together so their defocus effect can substantially cancel each other. From (Eq.42), the sum (or total) image intensity is the sum of image intensities from all open (i.e. selected) source points, thus the image intensity derivative are the sum of image intensity derivatives from all open source points. For example, for focus variation, $$a = \sum_{p=1}^{P} a_p$$

$$b = \sum_{p=1}^{P} b_p$$

where a and b are the first order and second order image intensity derivatives for the combined set of selected source points, while $a_p$ and $b_p$ are the first order and second order image intensity derivatives associated with p-th open source point. So an alternative strategy is to choose those source points p so that the magnitude of the first and or second order image intensity derivatives around the worst critical points is minimized. Suppose we are to choose K out of N source points (p=1, . . . , N) and the optimal source points chosen from this strategy are $\{t_1, \ldots, t_K\}$, then $$\{t_1, \ldots, t_K\} = \operatorname*{argmin}_{\{(p_1, \ldots, p_K) | 1 \le p_1 < \ldots < p_K \le N\}} \left\| \frac{1}{K} \sum_{i=1}^{K} b_{p_i}(x_c, y_c) \right\| =$$

$$\operatorname*{argmin}_{\{(p_1, \ldots, p_K) | 1 \le p_1 < \ldots < p_K \le N\}} \max_{\text{all critical points } (x_c, y_c)} \left| \frac{1}{K} \sum_{i=1}^{K} b_{p_i}(x_c, y_c) \right|$$

where $$\sum_{i=1}^{K} b_{p_i}(x_c, y_c)$$

represents the second order image intensity derivative from source points $\{p_1, \ldots, p_K\}$ at critical point $(x_c, y_c)$.

This object function will lead to the optimal illumination. In a naïve brute-force approach trying out all possible combinations of K out of N source points, the computational cost (i.e., the number of possible combinations) is in the order of $$C_N^K = \frac{N!}{K!(N-K)!}.$$

Figure 9:
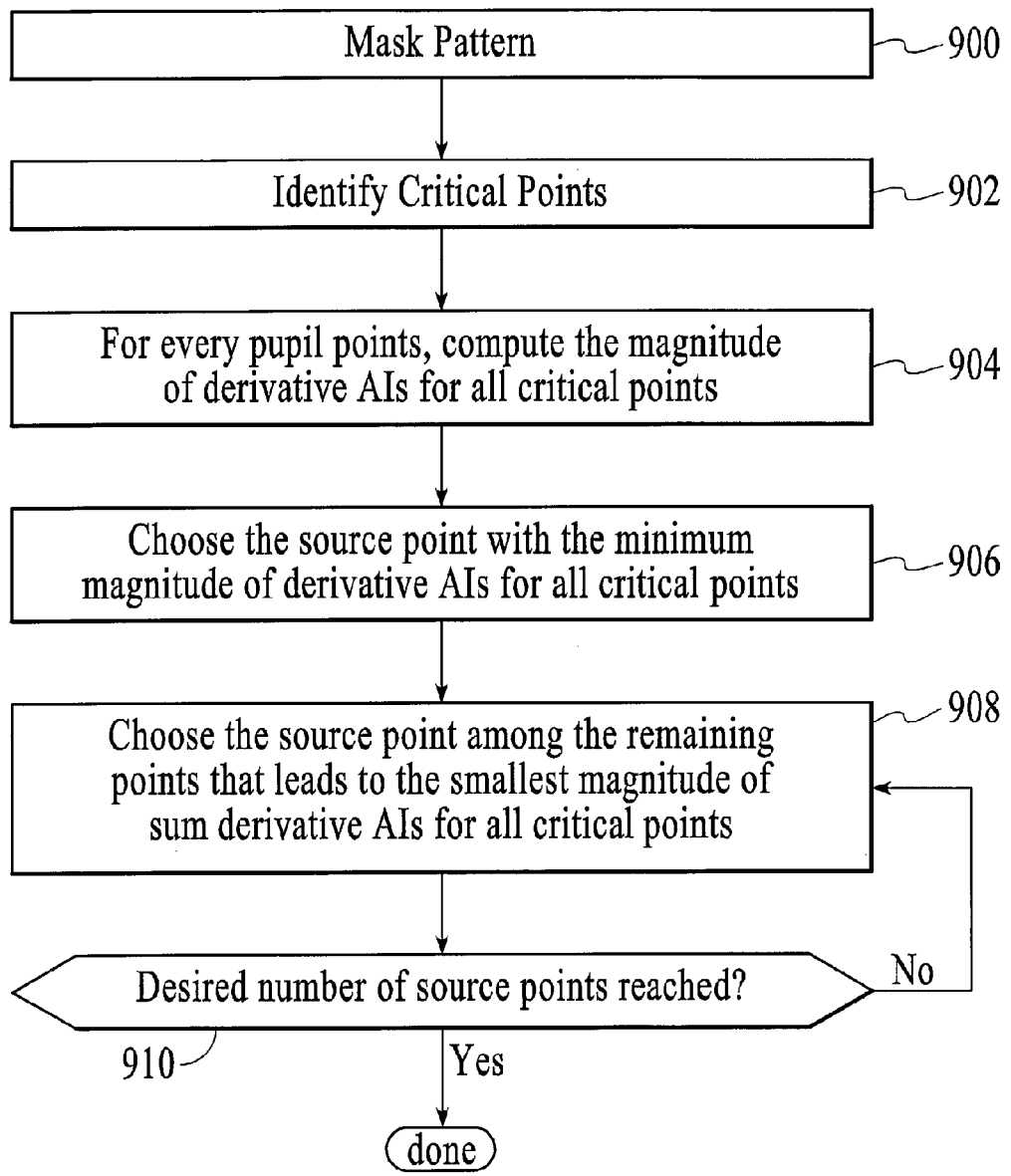
FIG. 9 is an exemplary flowchart illustrating another variation of the illumination optimization process.

In an embodiment which is less expensive for a large number of total source points N another greedy approach is used (FIG. 9). This strategy is similar to the one demonstrated in FIG. 7. The first step in this illumination optimization process (Step 900) is again to identify the target pattern (also referred to as the mask pattern) for which the illumination will be optimized. The next step in the process (Step 902) is to identify optimization points within the target circuit pattern or mask pattern. In this embodiment critical points are chosen and as noted above, critical points may include, but are not limited to, critical circuit modules or cells, such as the most densely spaced cells, or alternatively cells contained on the target IC's critical paths. In Step 904, $b_{(x_p,y_p)}(x_c, y_c)$, associated with the individual source points $(x_p,y_p)$ are determined for each critical circuit point $(x_c, y_c)$.

Next, in Step 906, the source point having the lowest image intensity derivative magnitude at the worst critical point, which corresponds to the source point which minimizes the maximum $|b_{(x_p,y_p)}(x_c, y_c)|$ among all critical points $(x_c,y_c)$, is selected. This step can be formulated as:

$$\operatorname*{argmin}_{\text{all pupil points } (x_p, y_p)} \left\| b_{(x_p, y_p)}(x_c, y_c) \right\| =$$

$$\operatorname*{argmin}_{\text{all pupil points } (x_p, y_p)} \max_{\text{all critical points } (x_c, y_c)} \left| b_{(x_p, y_p)}(x_c, y_c) \right|$$

Thus, rephrased more generically, the optimization point (in the target pattern) which has the largest minimum value for the magnitude of the second order coefficient associated with an individual illumination source point is determined. Also, the associated individual illumination source point is selected.

As indicated for this embodiment, illumination source points with coefficients of opposite sign are to be selected. The pair of illumination source point will be completed in the next step.

In the next step, step 908, the illumination source point among the remaining illumination source points that leads to the minimum magnitude of the derivative of the aerial image intensity around the same worst critical point is selected (i.e., opened). Assuming that the set of already opened source points is $P_{open}$ and the set of remaining illumination source points is $P_{remaining}$, then this step is to look for the illumination source point:

$$\operatorname*{argmin}_{\text{each pupil point } p \in P_{remaining}} \left\| \sum_{p' \in P_{open}} b_{p'}(x_c, y_c) + b_p(x_c, y_c) \right\|$$

Thus a pair of illumination source points (p,p') is determined in a greedy way. It will be clear to the skilled person that instead of a pair of illumination source points, a larger plurality of illumination source points can be selected in an analogue way.

The process then proceeds to Step 910 in which it is determined if the desired number of source points have been selected (as noted above, this number is set from the requirement on AI intensity by the fabrication process). If the number of selected (i.e., open) source points equals the desired number of source points set by the fabrication process, the process is complete and the selected source points define the optimized illumination. If the number of currently selected source points is less than the desired number, the process returns to Step 908 to select the next best source point and then returns to Step 910. This reiterative process continues until the desired number of source points has been selected. In variants of this embodiment other iteration criteria are used as explained before.

Figure 10:
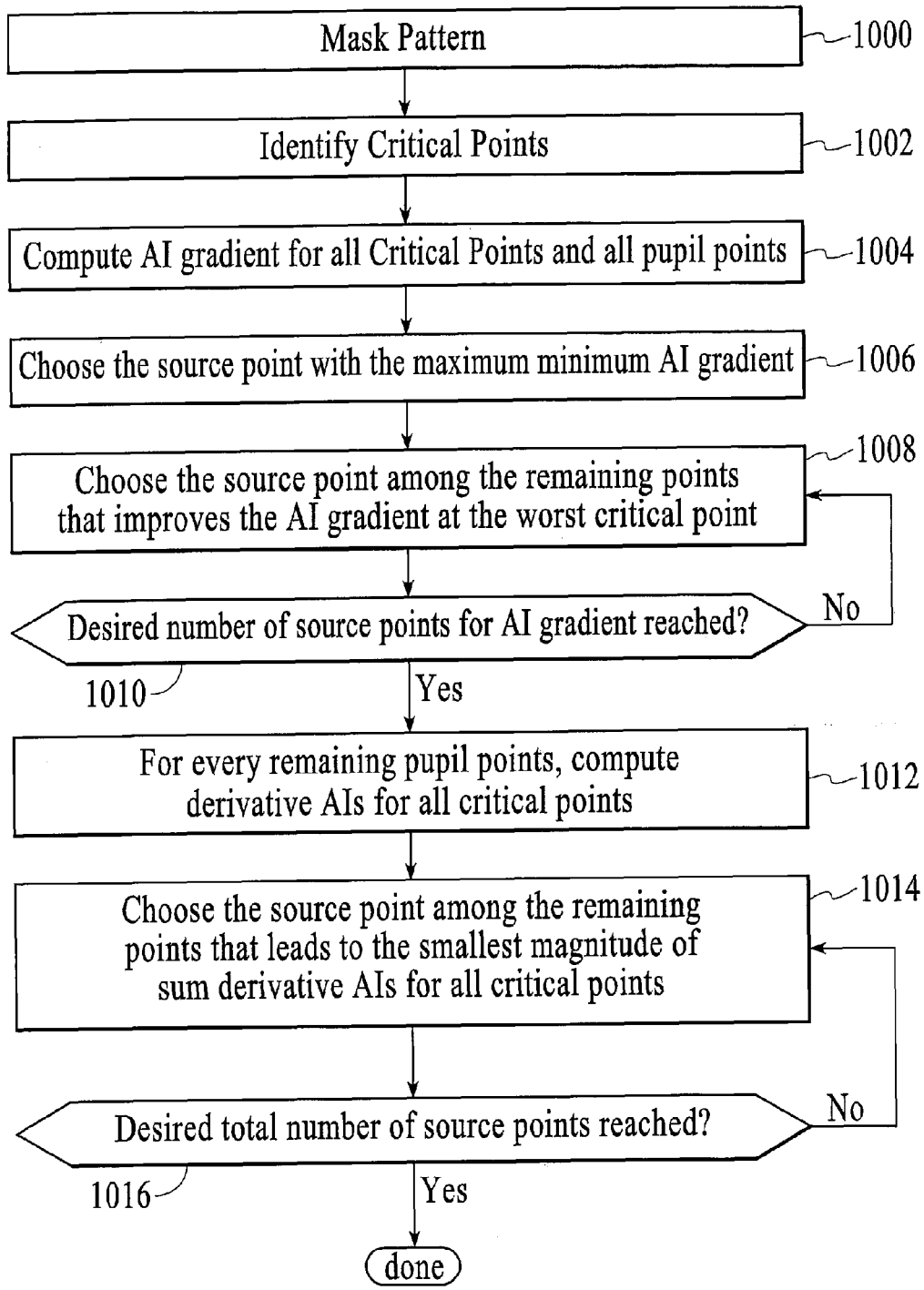
FIG. 10 is an exemplary flowchart illustrating another variation of the illumination optimization process.

In another embodiment, the edge-slope-maximization-based illumination optimization and the defocus-sensitivity-minimization-based illumination optimization are combined. In an advantageous combinational embodiment, after selecting the source points that provide the highest edge slope, it is possible to select a small amount of additional source points that have the largest defocus coefficients opposite to the sign of the already-selected source points, so as to cancel out the defocus sensitivity as much as possible. This is shown by the flowchart set forth in FIG. 10.

It is noted that it is possible to optimize all source points without interdependency. However, as a practical matter this is usually not necessary because of the symmetry of a typical pupil. Generally, it is acceptable to assume an 8-fold symmetry or Horizontal/Vertical symmetry of the illumination pupil when optimizing for structures of one orientation. In the 8-fold symmetry, we assume that the 8 source points $(x_p,y_p)$, $(x_p,-y_p)$, $(-x_p,y_p)$, $(-x_p,-y_p)$, $(y_p,x_p)$, $(y_p,-x_p)$, $(-y_p,x_p)$, and $(-y_p,-x_p)$ always have the same value, i.e., the source map is symmetric with respect to horizontal, vertical, and 45 degree directions. In the Horizontal/Vertical symmetry, we assume that the symmetry is with respect to only the horizontal and vertical orientations then 4 source points $(x_p,y_p)$, $(x_p,-y_p)$, $(-x_p,y_p)$, and $(-x_p,-y_p)$ always have the same value. For an 8-fold symmetry of the pupil, it is only necessary to consider ⅛ of the pupil (i.e., ½ of a quarter). Note that in the examples shown in FIG. 7 and FIG. 9, we assume a 8-fold symmetry and add one source point in the ⅛ of the pupil at a time (in fact, we are adding 8 points in the whole source plane at a time). However, if we only have Horizontal/Vertical symmetry and do not enforce the symmetry along the 45 degree direction, we may need to add one or two pupil points in one quarter of the pupil at a time, depending on which yields the better result. For the Horizontal/Vertical symmetry, if we still add one pupil point at a time, some pupil points may have inferior imaging performance individually; however, their performance may be well compensated by other pupil points. Therefore, we should add one or a pair of extra pupil point(s) each time, depending on which one has the larger improvement on the derivative image magnitude averaged over the number of pupil points.

The foregoing illumination optimization processes result in a selection of illumination pupil points of an illuminator (IL) of a lithographic exposure apparatus which are to be used when exposing a substrate to the image of the target pattern (i.e. a selection of open illumination points), whereas the not selected (i.e. closed) illumination pupil points will not irradiate the target pattern. As will be known to the skilled person, a simple transmissive pupil of an optical component corresponds to an aperture allowing radiation to pass. In other words and more generally phrased, opening the selection of illumination points can be understood to determine the illumination pupil shape. The illumination optimization process described above may be used with any form of illuminator or combination of source, beam delivery components (used to deliver radiation from the source to the illuminator) and illuminator (IL) arranged to accomplish this. In an embodiment an illumination pupil filter is placed in the pupil plane of the illuminator (IL). The illumination pupil filter is arranged to substantially filter away radiation at illumination points which are not selected while it outputs radiation from the illumination points which are selected. In this embodiment, the illumination pupil shape corresponds to the illumination pupil filter. It is advantageous to place an illumination pupil filter in the pupil plane of the illuminator (IL) as the simulation results of the embodiments of the invention can be directly used to determine the illuminator pupil filter properties and the implementation in the combination of source, beam delivery components and illuminator are relatively simple. In an embodiment the results of the illumination optimization are used to define a diffractive optical element (DOE) to be placed in the optical path of the illumination radiation upstream of the patterning device (MA). In this embodiment, the diffractive optical element is arranged so that corresponds to diffracting away radiation from the patterning device at illumination pupil points which are not selected and that it corresponds to output radiation towards the patterning device at points which are selected. Such a diffractive optical element (DOE) however has a fixed shape, is expensive, has a long order lead time and is optimized for a certain target pattern. Lithographic exposure apparatus are often used for various target patterns. In an advantageous embodiment a programmable mask is used as the illumination pupil filter. More specifically, the optimal illumination pupil filter, which is defined by the result of the foregoing optimization processes, can be programmed or implemented utilizing a programmable mask or other radiation-intensity-modulators. As a result, the improvement in the DFM metrics and imaging results associated with the illumination optimization process can be obtained fast (as programming the settings can be done off-line or in parallel with ongoing production) and without any additional cost for various target designs within one lithographic exposure apparatus.

Figure 11:
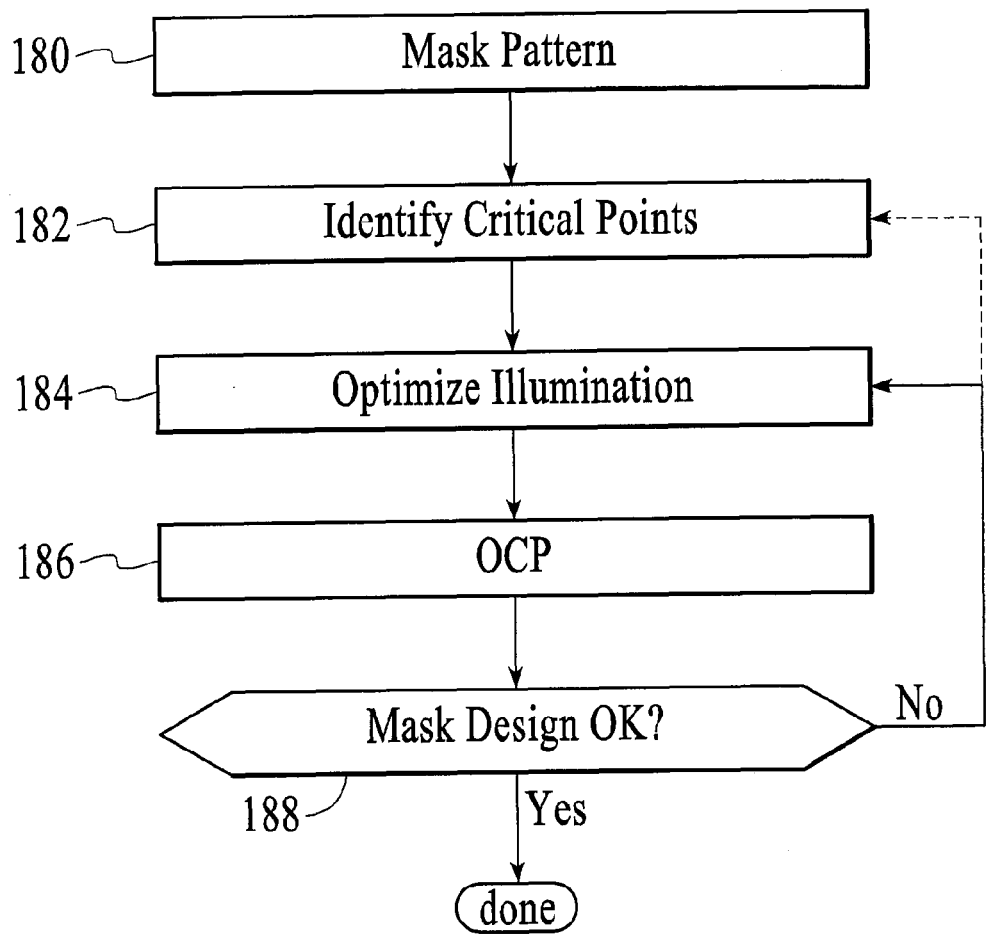
FIG. 11 is an exemplary flowchart illustrating the joint optimization of the illumination source and the mask in accordance with an embodiment of the present invention.

In a variation of the foregoing, it is possible to combine the illumination optimization with Optical Proximity Correction (OPC) design/optimization to jointly optimize the mask and the source. Referring to FIG. 11, which is an exemplary flowchart illustrating the joint optimization of the illumination source and the mask (including but not limited to OPC and Sub-Resolution Assist Feature (SRAF) placement), the first step (Step 180) and second step (Step 182) in the process is to identify the mask pattern and the optimization points of the pattern. The optimization points may be determined in different ways such as randomly. In an embodiment the mask pattern and the optimization points are determined in the same manner as Steps 260 and 262, respectively, in the process illustrated in FIG. 6 (i.e. critical points are determined). Thereafter, the mask and the source can be co-optimized by performing a reiterative process in which the illumination filter is optimized first (Step 184) utilizing, for example, either of the foregoing source optimization methods detailed above, followed by an optimizing process for the patterning device such as an OPC process (Step 186) for a mask (the optimized illumination filter may reduce the complexity of OPC design, and hence reduce the mask cost). Once the OPC process is completed, the process returns back to the illumination filter optimization process/source optimization (Step 184), which is followed again by the OPC process (Step 186) (from original pre-OPC design, not from the previously Post-OPC design, since the pre-OPC design, i.e., the design target, remains unchanged). This reiterative process is performed until an iteration criterion is met, for instance in that there is convergence, Step 188, (i.e., there is no further improvement in either the source or mask design). Alternatively the reiterative process in performed until an iteration criterion is met for the mask design after which the illumination is optimized once more. At this stage, the process is complete. It will be clear to the skilled person that existing, well known methods and software can be used for performing the optimization process for the patterning device.

In another variation, the optimization process for the patterning device (such as the OPC process) can also be combined with design inspection to identify hot spots as the critical points in the circuit pattern or change the cost function to better improve the areas with dense hot spots. Therefore, in FIG. 11, when the OPC process is completed, the process can return back to Step 182 instead of Step 184 to re-identify critical points. As explained earlier, also after completing the last OPC process the illumination optimization process may be run once more, for instance after identifying the critical points based on the file mask design.

Figure 12:
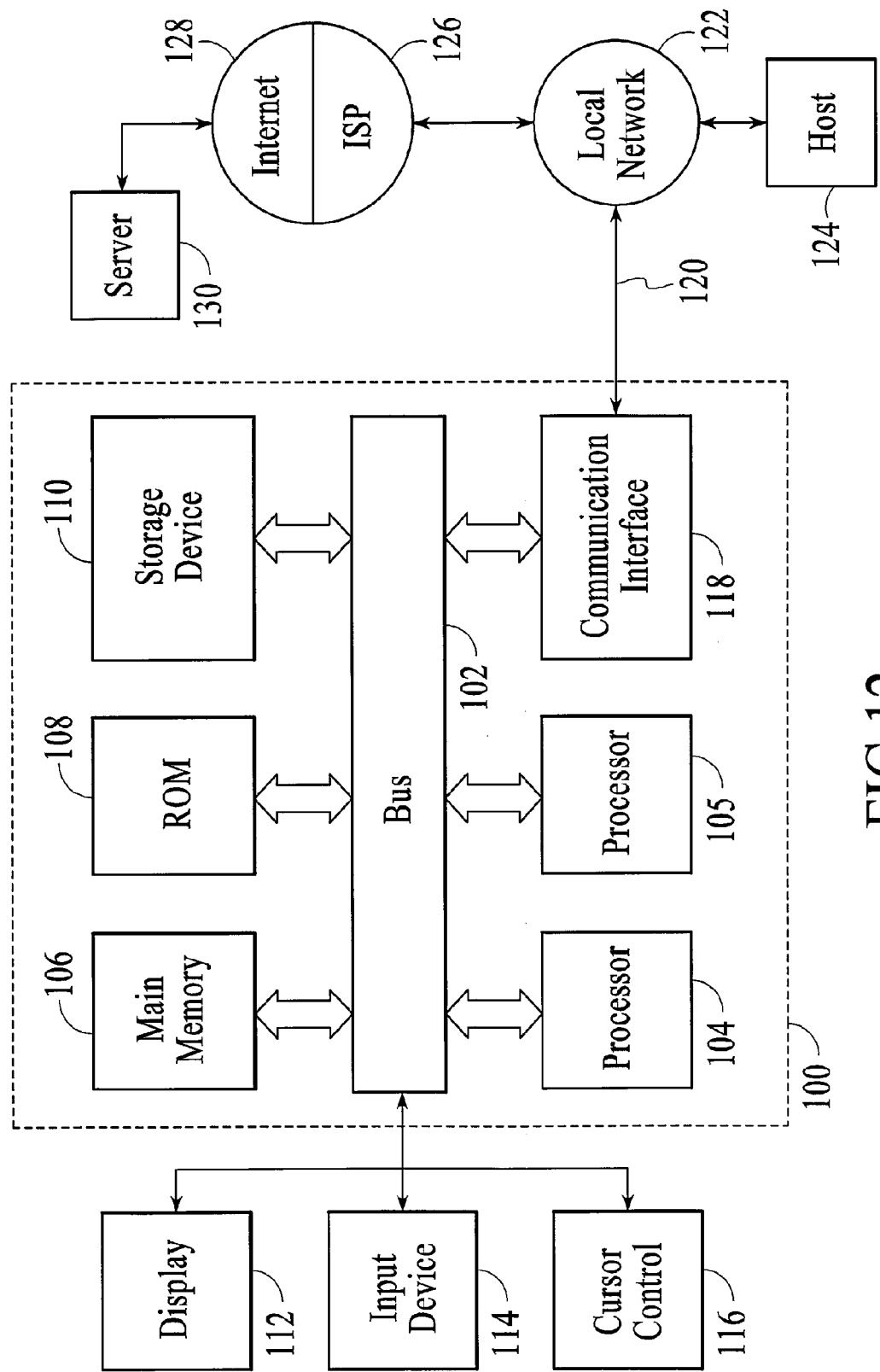
FIG. 12 is a block diagram that illustrates a computer system which can assist in the implementation of the simulation method of the present invention.

FIG. 12 is a block diagram that illustrates a computer system (100) which can assist in the optimization method disclosed herein. The computer system (100) includes a bus (102) or other communication mechanism for communicating information, and a processor (104) coupled with the bus (102) for processing information. The computer system (100) also includes a main memory (106), such as a random access memory (RAM) or other dynamic storage device, coupled to the bus (102) for storing information and instructions to be executed by the processor (104). The main memory (106) also may be used for storing temporary variables or other intermediate information during execution of instructions to be executed by the processor (104). The computer system (100) further includes a read only memory (ROM) (108) or another static storage device coupled to the bus (102) for storing static information and instructions for the processor (104). A storage device (110), such as a magnetic disk or optical disk, is provided and coupled to the bus (102) for storing information and instructions.

The computer system (100) may be coupled via the bus (102) to a display (112), such as a cathode ray tube (CRT) or flat panel or touch panel display for displaying information to a computer user. An input device (114), including alphanumeric and other keys, is coupled to the bus (102) for communicating information and command selections to the processor (104). Another type of user input device is a cursor control (116), such as a mouse, a trackball, or cursor direction keys for communicating direction information and command selections to the processor (104) and for controlling cursor movement on the display (112). This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by the computer system (100) in response to the processor (104) executing one or more sequences of one or more instructions contained in the main memory (106). Such instructions may be read into the main memory (106) from another computer-readable medium, such as a storage device (110). Execution of the sequences of instructions contained in the main memory (106) causes the processor (104) to perform the process steps described herein. One or more processors (104, 105) in a multi-processing arrangement may also be employed to execute the sequences of instructions contained in the main memory (106). In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to the processor (104) for execution. Such a medium may take many forms, including but not limited to, non-volatile media, volatile media, and transmission media. Non-volatile media include, for example, optical or magnetic disks, such as the storage device (110). Volatile media include dynamic memory, such as the main memory (106). Transmission media include coaxial cables, copper wire and fiber optics, including the wires that comprise the bus (102). Transmission media can also take the form of acoustic or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to the processor (104) for execution. For example, the instructions may initially be borne on a magnetic disk of a remote computer. The remote computer can load the instructions into its dynamic memory and send the instructions over a telephone line using a modem. A modem local to the computer system (100) can receive the data on the telephone line and use an infrared transmitter to convert the data to an infrared signal. An infrared detector coupled to the bus (102) can receive the data carried in the infrared signal and place the data on the bus (102). The bus (102) carries the data to the main memory (106), from which the processor (104) retrieves and executes the instructions. The instructions received by the main memory (106) may optionally be stored on the storage device (110) either before or after execution by the processor (104).

The computer system (100) also preferably includes a communication interface (118) coupled to the bus (102). The communication interface (118) provides a two-way data communication coupling to a network link (120) that is connected to a local network (122). For example, the communication interface (118) may be an integrated services digital network (ISDN) card or a modem to provide a data communication connection to a corresponding type of telephone line. As another example, the communication interface (118) may be a local area network (LAN) card to provide a data communication connection to a compatible LAN. Wireless links may also be implemented. In any such implementation, the communication interface (118) sends and receives electrical, electromagnetic or optical signals that carry digital data streams representing various types of information.

A network link (120) typically provides data communication through one or more networks to other data devices. For example, the network link (120) may provide a connection through a local network (122) to a host computer (124) or to data equipment operated by an Internet Service Provider (ISP) (126). The ISP (126) in turn provides data communication services through the worldwide packet data communication network, now commonly referred to as the "Internet" (128). The local network (122) and the internet (128) both use electrical, electromagnetic or optical signals that carry digital data streams. The signals through the various networks and the signals on the network link (120) and through the communication interface (118), which carry the digital data to and from the computer system (100), are exemplary forms of carrier waves transporting the information.

The computer system (100) can send messages and receive data, including program code, through the network(s), the network link (120), and the communication interface (118). In the Internet example, a server (130) might transmit a requested code for an application program through Internet (128), the ISP (126), the local network (122) and the communication interface (118). In accordance with the invention, one such downloaded application provides for the illumination optimization of the embodiment, for example. The received code may be executed by the processor (104) as it is received, and/or stored in the storage device (110), or other non-volatile storage for later execution. In this manner, the computer system (100) may obtain application code in the form of a carrier wave.

Figure 13:
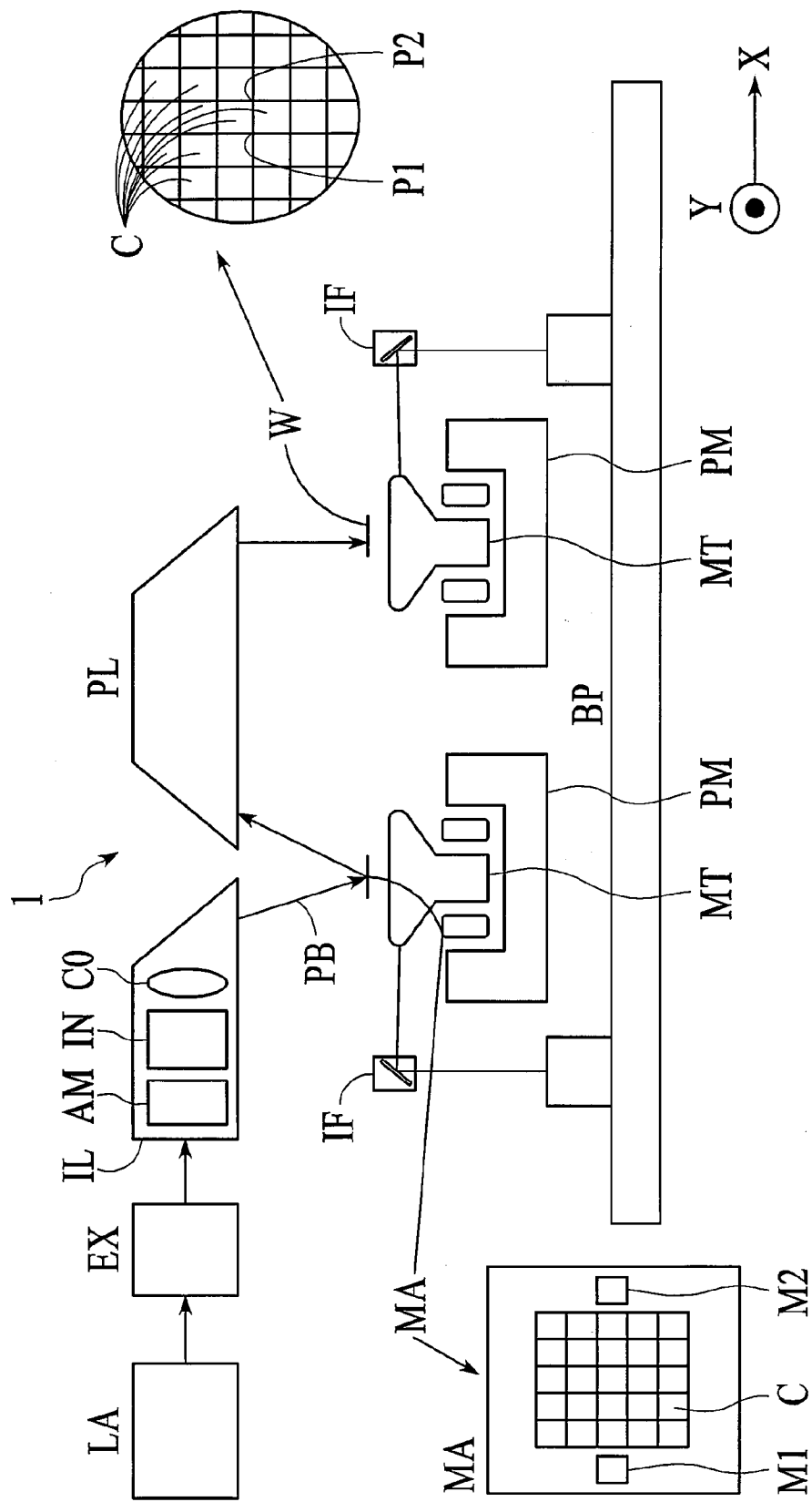
FIG. 13 schematically depicts a lithographic projection apparatus suitable for use with the method of the present invention.

FIG. 13 schematically depicts an exemplary lithographic exposure apparatus whose illumination source could be optimized utilizing the process of present invention. The apparatus comprises:

- a radiation system (EX, IL), for supplying a projection beam (PB) of radiation. In this particular case, the radiation system also comprises a radiation source (LA);
- a first object table (mask table) (MT) provided with a mask holder for holding a mask (MA) (e.g., a reticle), and connected to first positioning means for accurately positioning the mask with respect to a projection system (PL);
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a reflective type (i.e., has a reflective mask). However, in general, it may also be of a transmissive type, for example (with a transmissive mask). Alternatively, the apparatus may employ another kind of patterning device as an alternative to the use of a mask; examples include a programmable mirror array or LCD matrix.

The source LA (e.g., a mercury lamp, excimer laser, an EUV light source or even an X-ray source) produces a beam of radiation for instance having a wavelength of 365, 248, 193 or 157 nm or a wavelength between roughly 20 nm and roughly 3 nm or 5 nm or within the range of X-rays. This beam is fed into an illumination system (illuminator) (IL), either directly or after having traversed conditioners, such as a beam expander Ex, and/or beam delivery components (not shown). Beam delivery components can for instance be simple mirrors used to reflect the radiation of the source towards the lithographic exposure apparatus. In an advantageous use, the source is allocated on a floor below (or above) the exposure apparatus or in a different room on the same floor, because the source requires different safety measures and/or environmental conditioning (number of dust particles). The illuminator IL may comprise one or more adjusting devices AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 13 that the source LA may be within the housing of the lithographic projection apparatus (as is often the case when the source LA is a mercury lamp, for example), but that it may also be remote from the lithographic projection apparatus, the radiation beam that it produces being led into the apparatus by beam delivery components (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having been reflected by the mask MA, the beam PB passes through the lens PL, which focuses the beam PB onto a target portion C of the substrate W. With the aid of the second positioning means (and for instance interferometric measuring means (IF) or alternatively by encoders), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In an embodiment, movement of the object tables (MT, WT) is be realized with the aid of a long-stroke module (coarse positioning) and a short-stroke module (fine positioning), which are not explicitly depicted in FIG. 13. However, in the case of a wafer stepper (as opposed to a step-and-scan tool) the mask table MT may just be connected to a short stroke actuator, or may be fixed.

The depicted tool can be used in two different modes:
In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "radiation valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

Although the present invention has been described and illustrated in detail, it is to be clearly understood that the same is by way of illustration and example only and is not to be taken by way of limitation, the scope of the present invention being limited only by the terms of the appended claims.

We claim:

1. A method of improving an illumination pupil shape for an illumination source used in a lithographic process, the lithographic process being configured to image a design layout, the method comprising the steps of:
    identifying a target pattern included in the design layout;
    identifying at least one optimization point in said target pattern, wherein the optimization point comprises a spatial point within the design layout based on which the pupil shape of the illumination source is to be improved;
    identifying at least one design for manufacturing metric per optimization point;
    selecting a set of illumination source points based on the identified at least one design for manufacturing metric; and
    determining the improved illumination pupil shape based on the selected set of illumination source points.

2. The method according to claim 1, comprising identifying a design for manufacturing metric based on at least one of an aerial image intensity slope, a mask error enhancement factor and a derivative of a critical dimension versus parameters of a process window of the lithographic process.

3. The method according to claim 1, further comprising optimizing the target pattern based on the determined illumination pupil shape.

4. The method according to claim 3, wherein optimizing the target pattern results in an optimized target pattern, the method further comprising determining a further set of optimization points based on the optimized target pattern and improving the illumination pupil shape based on the optimized target pattern and the further set of optimization points.

5. The method according to claim 1, comprising:
    identifying an acceptable range for each the at least one design for manufacturing metric per optimization point; and
    selecting the set of illumination source points for illuminating the target pattern such that the design for manufacturing metric is within the acceptable range for each optimization point and for each design for manufacturing metric.

6. The method according to claim 5, comprising:
    sorting the illumination points for each combination of design for manufacturing metric and optimization point to provide a sorted order based on the value of the design for manufacturing metric in the combination;
    assembling a plurality of further sets of illumination points by selecting a further set of illumination points per combination of design for manufacturing metric and optimization point based on the sorted order; and
    determining the set of illumination points by selecting illumination points from the intersection of further sets of illumination points.

7. The method according to claim 1, comprising:
    defining a cost function based on the at least one design for manufacturing metric; and
    performing an iteration process comprising:
        determining the value of the cost function for an illumination source point; and
        improving the illumination pupil shape by adding illumination source points to a set of selected illumination source points based on corresponding values of the cost function until an iteration criterion is met.

8. The method according to claim 7, wherein illumination source points in the set of selected illumination source points are not re-evaluated during a later iteration.

9. The method according to claim 7, comprising:
    determining the second order coefficient in a polynomial representation of aerial image intensity (I) as a function of a parameter of a process window of the lithographic process; and
    identifying at least one design for manufacturing metric to be the magnitude of the second order coefficient.

10. The method according to claim 8, comprising:
    determining a worst case optimization point by determining which optimization point has the largest minimum value for the magnitude of the second order coefficient associated with an individual illumination source point;
    selecting the associated individual illumination source point with the minimum value of the magnitude of the second order coefficient for that optimization point; and
    selecting a further illumination source point having an opposite effect on the second order coefficient in that optimization point.

11. The method according to claim 7, comprising:
    defining interdependency relations between illumination source points based on symmetry in the illumination source; and
    selecting interdependent illumination source points based on the interdependency relations.

12. A device manufacturing method comprising:
    patterning a beam of radiation from the illumination source with a patterning device that includes the design layout;
    exposing a substrate to the patterned beam of radiation; and
    using the improved illumination pupil shape for the illumination source determined in claim 1.

13. The device manufacturing method according to claim 12, comprising using an illumination pupil shape filter.

14. The device manufacturing method according to claim 13, comprising:
    either using the determined improved illumination pupil shape to program a programmable device in the pupil plane of the illumination source, or
    using a diffractive optical element having a diffractive pattern corresponding to the determined illumination pupil shape in the pupil plane of the illuminator source.

15. The method of producing a diffractive optical element, comprising:
    determining the improved illumination pupil shape according to claim 1, and
    producing a diffractive pattern on the diffractive optical element based on the determined improved illumination pupil shape.

16. A non-transitory computer readable medium bearing a computer program for improving an illumination pupil shape for an illumination source used in a lithographic process, the lithographic process being configured to image a design layout, the computer program, when executed, causing a computer to perform the steps of claim 1.

* * * * *